(12) United States Patent
Katsumi et al.

(10) Patent No.: US 9,137,936 B2
(45) Date of Patent: Sep. 15, 2015

(54) ELECTRONIC-CIRCUIT-COMPONENT SUPPLYING DEVICE

(75) Inventors: Hiroshi Katsumi, Chiryu (JP); Yukinori Takada, Anjo (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 284 days.

(21) Appl. No.: 13/519,259

(22) PCT Filed: Nov. 22, 2010

(86) PCT No.: PCT/JP2010/070783
§ 371 (c)(1),
(2), (4) Date: Jun. 26, 2012

(87) PCT Pub. No.: WO2011/077880
PCT Pub. Date: Jun. 30, 2011

(65) Prior Publication Data
US 2012/0285628 A1 Nov. 15, 2012

(30) Foreign Application Priority Data
Dec. 26, 2009 (JP) ................................. 2009-296461

(51) Int. Cl.
*H05K 13/04* (2006.01)
*H05K 13/02* (2006.01)
(52) U.S. Cl.
CPC .......... *H05K 13/0417* (2013.01); *H05K 13/021* (2013.01); *H05K 13/0408* (2013.01); *Y10S 156/93* (2013.01); *Y10S 156/941* (2013.01); *Y10T 156/1994* (2015.01)
(58) Field of Classification Search
CPC .......... H05K 13/0417; H05K 13/0408; H05K 13/021

USPC ........ 156/714, 761, 930, 931; 221/25, 72, 73, 221/79, 87; 414/411, 412, 416.01, 416.03, 414/416.05, 416.08, 425, 811
See application file for complete search history.

(56) References Cited

U.S. PATENT DOCUMENTS 6,869,040 B2 * 3/2005 Eskang .......................... 242/560
2002/0014002 A1 2/2002 Bergstrom
(Continued)

FOREIGN PATENT DOCUMENTS

| CN | 101277605 A | 10/2008 |
|---|---|---|
| JP | A-2-205398 | 8/1990 |

(Continued)

OTHER PUBLICATIONS

Office Action issued in Japanese Application No. 2013-166498 dated Mar. 4, 2014 (with translation).
(Continued)

*Primary Examiner* — Mark A Osele
(74) *Attorney, Agent, or Firm* — Oliff PLC

(57) ABSTRACT

A plurality of tape feeders are held by a feeder holding device in a state in which component supply portions of the respective tape feeders are arranged in a plurality of rows each extending along a plurality of straight lines parallel to each other in one plane. Each of the plurality of tape feeders is separable into first portions and second portions, the first portions include: a reel holding portion configured to hold a reel on which a taped component is wound; the component supply portion; a taped-component guide portion configured to guide, to the component supply portion, the taped component drawn from the reel, the second portions respectively including taped-component feeding devices each for feeding the taped component to the component supply portion.

10 Claims, 21 Drawing Sheets

(56) References Cited

U.S. PATENT DOCUMENTS

| | | | |
|---|---|---|---|
| 2003/0010790 A1 | 1/2003 | Van Der Rust | |
| 2003/0046808 A1 | 3/2003 | Eskang | |
| 2006/0102681 A1* | 5/2006 | Ricketson | 226/128 |
| 2008/0217459 A1* | 9/2008 | Wada | 242/389 |

FOREIGN PATENT DOCUMENTS

| | | |
|---|---|---|
| JP | A-04-076997 | 3/1992 |
| JP | A-4-237194 | 8/1992 |
| JP | A-08-148881 | 6/1996 |
| JP | A-10-308599 | 11/1998 |
| JP | A-2002-16393 | 1/2002 |
| JP | A-2002-533944 | 10/2002 |
| JP | A-2003-78291 | 3/2003 |
| JP | A-2003-188591 | 7/2003 |
| JP | A-2004-47951 | 2/2004 |
| JP | A-2004-514279 | 5/2004 |
| JP | A-2005-503032 | 1/2005 |
| JP | A-2005-116904 | 4/2005 |
| JP | A-2005-235803 | 9/2005 |
| JP | A-2008-193127 | 8/2008 |

OTHER PUBLICATIONS

International Search Report issued in International Patent Application No. PCT/JP2010/070783 dated Dec. 21, 2010.

Aug. 1, 2014 Chinese Office Action issued in Chinese Application No. 201080059250.2 (with English translation).

* cited by examiner

ELECTRONIC-CIRCUIT-COMPONENT SUPPLYING DEVICE

TECHNICAL FIELD

The present invention relates to a device for supplying an electronic circuit component, provided on an electronic-circuit-component mounting machine or the like for mounting the electronic circuit component onto a circuit substrate and in particular to a technique for increasing the number of kinds of suppliable electronic circuit components.

BACKGROUND ART

An electronic-circuit-component mounting machine (hereinafter abbreviated as "component mounting machine" unless otherwise required) generally includes: a circuit-substrate holding device for holding a circuit substrate; an electronic-component supplying device (hereinafter abbreviated as "component supplying device" unless otherwise required) for supplying an electronic circuit component (hereinafter abbreviated as "component" unless otherwise required); and a component mounting machine configured to receive the component from the component supplying device and mounts the component onto the circuit substrate held by the substrate holding device. As the component supplying device, a device including the plurality of tape feeders and a feeder holding device for holding the feeders is widely used. Each of the tape feeders is configured to feed a taped component in a longitudinal direction of a carrier tape. The taped component has a plurality of component-accommodating recesses arranged at regular pitches in the longitudinal direction and each accommodating the component. Each tape feeder is configured to sequentially position the plurality of component-accommodating recesses at a component supply portion. The tape feeders are held by the feeder holding device in a state in which the component supply portions are arranged in a direction parallel to a straight line.

Each tape feeder is for supplying the components of one kind. Thus, where there are many kinds of components to be mounted on the circuit substrate, a multiplicity of the tape feeders need to be held on the feeder holding device. However, a width of the feeder holding device is limited, thereby limiting the number of the tape feeders which can be held on the feeder holding device. Thus, a plurality of the component mounting machines are used for an operation to mount the components onto one circuit substrate. Therefore, an increase in the number of the tape feeders mountable on a single component mounting machine is extremely effective to reduce the number of necessary component mounting machines and thereby to achieve lower equipment cost. Further, if the number of the tape feeders mountable on the single component is increased, the tape feeders for supplying the various kinds of components to be mounted on the circuit substrate can be held on the feeder holding device together with each other, which can reduce a man-power required for a changeover.

One proposal for this has been made in Patent Document 1. That is, there has been proposed that feeder tables on which the tape feeders are mounted are provided in tiers in an up and down direction, and these multi-tier feeder tables are moved upward and downward to position a component supply portion of the tape feeder located on each feeder table, at a component supply position so as to allow the component mounting machine to receive the component.

PRIOR ART DOCUMENT

Patent Document

Patent Document 1 JP-A-2005-235803

SUMMARY OF THE INVENTION

Problem to be Solved by the Invention

As described above, if the feeder tables are provided in tiers in the up and down direction, the multiplicity of tape feeders can be mounted on the component mounting machine having a limited width. In the component supplying device, however, there is still room for improvements. For example, the raising and lowering device is required for moving the multi-tier feeder tables upward and downward as described above. This complicates the construction of the component mounting machine, leading to higher equipment cost. Further, a time for moving the feeder tables upward and downward is additionally required, inevitably lowering an efficiency of the mounting operation. This problem is one example of problems hindering an improvement of utility of the conventional component mounting machine. In view of the above, there is room for improvements for the component mounting machine and the component supplying device from various viewpoints.

The present invention has been developed in view of the above-described situations to improve a conventional component supplying device to improve utility of a component mounting machine and a component supplying device by increasing the number of mountable tape feeders without providing a raising and lowering device, for example.

Means for Solving Problem

The present invention provides an electronic-circuit-component supplying device comprising: a plurality of tape feeders each configured to feed a taped component in a longitudinal direction of a carrier tape, the taped component having a plurality of component-accommodating recesses arranged at regular pitches in the longitudinal direction and each accommodating an electronic circuit component, the plurality of tape feeders each being configured to sequentially position the plurality of component-accommodating recesses at a component supply portion; and a feeder holding device configured to hold the plurality of tape feeders, wherein the feeder holding device is configured to hold the plurality of tape feeders in a state in which the respective component supply portions of the plurality of tape feeders are arranged in a plurality of rows along a plurality of straight lines extending parallel to each other in one plane.

Effect of the Invention

Since the feeder holding device is configured to hold the plurality of tape feeders in the state in which the respective component supply portions of the plurality of tape feeders are arranged in the plurality of rows along the plurality of straight lines extending parallel to each other in one plane as described above, the number of the tape feeders which can be held on the feeder holding device having a limited width is increased, and since the component supply portions are located in one plane, there is no need to move the feeder holding device upward or downward. That is, it is possible to improve utility of the component mounting machine while suppressing an increase in equipment cost.

Forms of the Invention

There will be described by way of examples forms of inventions recognized to be claimable by the present applicant. The inventions may be hereinafter referred to as "claimable inventions", and include at least the invention as defined in the appended claims, which may be referred to as "the invention" or "the invention of the present application". However, the inventions may further include an invention of a concept subordinate or superordinate to the concept of the invention of the present application, and/or an invention of a concept different from the concept of the invention of the present application. The forms are numbered like the appended claims and depend on another form or forms, where appropriate. This is for easier understanding of the claimable invention, and it is to be understood that combinations of constituent elements that constitute the claimable inventions are not limited to those of the following forms. That is, the claimable inventions are to be construed by taking account of the description following each form, the description of the embodiments, the related art, and others, and as long as the claimable inventions are constructed in this way, any form in which one or more elements are added to or deleted from any one of the following forms may be considered as one form of the claimable invention.

In the following explanation, a side of a component supplying device where a component supply portion is provided is called a front side, and a side of a component supplying device where a reel holding portion is provided is called a rear side.

(1) An electronic-circuit-component supplying device comprising:

a plurality of tape feeders each configured to feed a taped component in a longitudinal direction of a carrier tape, the taped component having a plurality of component-accommodating recesses arranged at regular pitches in the longitudinal direction and each accommodating an electronic circuit component, the plurality of tape feeders each being configured to sequentially position the plurality of component-accommodating recesses at a component supply portion; and a feeder holding device configured to hold the plurality of tape feeders, wherein the feeder holding device is configured to hold the plurality of tape feeders in a state in which the respective component supply portions of the plurality of tape feeders are arranged in a plurality of rows along a plurality of straight lines extending parallel to each other in one plane.

In a configuration in which the feeder holding device removably holds the plurality of tape feeders, an effect in which a time required for a changeover of component supply is shortened is obtained by replacing various kinds of the tape feeders to change a configuration of the component supplying device or by mounting, onto the feeder holding device, a tape feeder on which a taped component is set in advance. However, this configuration is not essential. That is, the taped component can be mounted on and removed from the tape feeder unremovably held by the feeder holding device.

It is noted that, though there has been described "the state in which the component supply portions are arranged in one plane" above, the component supply portions do not need to be arranged in one plane in a strict sense. As long as the component holder can take out the electronic circuit component as if the component supply portions are arranged in one plane, a height difference in a direction perpendicular to the one plane may exist between the plurality of the component supply portions. For example, where the component holder is a suction nozzle, the suction nozzle is normally designed to be capable of advancing and retreating relative to a nozzle holding portion and be urged to a front end position, so that the suction nozzle reduces variation in a raising and lowering stroke of the nozzle holding portion and a variation in heights of the component supply portions. Therefore, when the suction nozzle is located within a range in which this reduction is possible or within a range in which a fluctuation of the urging force of the suction nozzle is allowed, the height difference in the direction perpendicular to the one plane may exist between the plurality of the component supply portions.

Further, the one plane is preferably a horizontal plane but may be inclined equal to or less than fifteen degrees with respect to the horizontal plane for a reason of peripheral devices such as a taking device for taking out the electronic circuit component. In any case, each component supply portion is preferably configured to allow the electronic circuit component to be taken out in the direction perpendicular to the one plane.

(2) The electronic-circuit-component supplying device according to the form 1, wherein each of the plurality of tape feeders includes:

a reel holding portion configured to hold a reel on which the taped component is wound;

the component supply portion;

a taped-component guide portion configured to guide, to the component supply portion, the taped component drawn from the reel; and a taped-component feeding device configured to feed the taped component to the component supply portion, and wherein the reel holding portion, the component supply portion, and the taped-component guide portion constitute a removable mounting unit integrally mountable on and removable from the feeder holding device.

The removable mounting unit is integrally mounted on and removed from the feeder holding device, but the feeder holding device in this configuration may or may not include the taped-component feeding device. The latter case is a case in which a component including the taped-component feeding device (a component that should be called a taped-component-feeding-device holding portion of the tape feeder) is mounted on and removed from the feeder holding device. In this case, the removable mounting unit may be indirectly mounted on and removed from the feeder holding device via the component including the feeding device and mounted on and removed from the feeder holding device or may be directly mounted on and removed from the feeder holding device.

In any case, where the reel holding portion, the component supply portion, and the taped-component guide portion are configured as the removable mounting unit integrally mountable on and removable from the feeder holding device including the feeding device, it is possible to reduce the constituent elements of a portion to be mounted and removed, when compared with a case in which the taped-component feeding device and a feeder body are separately mounted and removed as in the conventional tape feeder. This achieves an effect of lowering the equipment cost. Further, since the reel holding portion, the component supply portion, and the taped-component guide portion are integrally mounted on and removed from the feeder holding device, the time required for the changeover of the component supplying device can be reduced, as in the case of the conventional tape feeder, by mounting, onto the feeder holding device, the removable mounting unit on which the taped component is set in advance. From this point of view, even where the feature described in the present form is employed independently of the feature described in the form (1), it is possible to achieve an effect of enhancing utility of the component supplying device. A feature described in each form depending on the present form can also be employed independently of the feature described in the form (1).

Further, it is easy to narrow a width of each of the component supply portion and the taped-component guide portion when compared with other portions of the tape feeder. It is relatively difficult to narrow a width of the reel holding portion, but it is possible to address this problem by employing a configuration described in form (19) or (29), which will be described below, to displace two mutually-interferring reel holding portions with respect to each other in the up and down direction or in the front and rear direction, for example. Further, it is also relatively difficult to narrow a width of the taped-component feeding device, but it is possible to address this problem by employing a configuration described in form (3) or (6) which will be described below, for example.

As a result, it becomes easy to realize the configuration in the form (1) by utilizing an advantage in which it is easy to narrow the width of each of the component supply portion and the taped-component guide portion. Each of configurations in forms (8) and (9) and so on which will be described below is one example of an effective means therefor.

(3) The electronic-circuit-component supplying device according to the form (2),
wherein each of the plurality of tape feeders is separable into a first portion and a second portion, the first portion including the reel holding portion, the component supply portion, and the taped-component guide portion, the second portion including the taped-component feeding device, and
wherein the first portion is the removable mounting unit that is mountable on and removable from the second portion.

In the conventional tape feeder, the first portion and the second portion are integral with each other, which makes it impossible to achieve an effect in which it is easy to narrow the width of each of the component supply portion and the taped-component guide portion. However, where the configuration in the present form is employed, the effect can be obtained.

(4) The electronic-circuit-component supplying device according to the form (3), wherein the taped-component feeding device includes:
a feeding member including at least one protruding portion engageable selectively with one of perforations formed in the carrier tape at regular pitches;
a drive device configured to drive the feeding member; and
an engaging/disengaging device configured to move at least the feeding member to an engaged position at which the protruding portion is engaged with the perforation and a disengaged position at which the protruding portion is disengaged from the perforation.

The engaging/disengaging device can be configured to move the feeding member and the drive device integrally with each other to the engaged position and the disengaged position and can be configured to move only the feeding member.

Where the configuration in the present form is employed, it becomes easy for the taped-component feeding device held by the second portion to feed the taped component held by the first portion in the configuration in which the first portion and the second portion are separable from each other.

(5) The electronic-circuit-component supplying device according to the form (3) or (4), wherein the second portion is mountable on and removable from the feeder holding device.

The second portion can be configured not to be mountable on and removable from the feeder holding device, but where the second portion is configured to be mountable and removable, it becomes easy to change the configuration of the component supplying device. A width of the tape feeder needs to be changed according to a dimension of the component to be supplied. When the width of the tape feeder is changed, the configuration of the component supplying device is changed accordingly. Where the configuration in the present form is employed, this change is facilitated.

(6) The electronic-circuit-component supplying device according to the form (5), wherein the second portion is capable of holding a plurality of the first portions as a removable-mounting-unit group.

Where the configuration in the present form is employed, the plurality of second portions are configured integrally with each other. Where the second portions are configured integrally, a plurality of the taped-component feeding devices each having difficulty in narrowing its width can easily be arranged in the relatively narrow integrated second portions, resulting in effective achievement of the advantage of the configuration in the form (2).

(7) The electronic-circuit-component supplying device according to any one of the forms (2) to (6), wherein each taped-component guide portion is a straight guide portion extending straight and inclined so as to be higher at an end portion thereof near the component supply portion than at an end portion thereof near the reel holding portion, and a plurality of the removable mounting units are arranged in a state in which a plurality of groups of the straight guide portions are spaced apart from one another in a direction that is parallel to a plane including the plurality of straight lines and that is perpendicular to the plurality of straight lines.

Where the configuration in the present form is employed, a multiplicity of the taped-component guide portions and the component supply portions can be arranged in an area having a small width, facilitating realizing the configuration in the form (1).

(8) The electronic-circuit-component supplying device according to any one of the forms (1) to (7),
wherein each of the plurality of tape feeders includes:
a reel holding portion configured to hold a reel on which the taped component is wound;
the component supply portion;
a taped-component guide portion configured to guide, to the component supply portion, the taped component drawn from the reel; and
a taped-component feeding device configured to feed the taped component to the component supply portion,
wherein the plurality of tape feeders are divided into N groups each corresponding to one of rows of the component supply portions, wherein N is a natural number equal to or greater than two,
wherein, in each of the N tape feeder groups, the component supply portions are arranged in an arrangement direction parallel to the plurality of straight lines at pitches each less in length than N times a width of each of the component supply portions, and
wherein, when a side of the tape feeder where the component supply portion is located is called a front side, and a side of the tape feeder where the reel holding portion is located is called a rear side, a peeled carrier tape from which the electronic circuit component has been taken out in one of the component supply portions belonging to a rear row is discharged frontward through a position between corresponding adjacent two of the component supply portions belonging to a front row.

The width of the conventional tape feeder has to be made wider than that of the taped component, but a width of the component supply portion is easily narrowed, and a space for allowing passage of the peeled carrier tape discharged from the component supply portion belonging to the rear row has only to be provided between the component supply portions adjacent to each other in the forefront row. As a result, when compared with a case in which the tape feeders are arranged in a row as in the conventional technique, more component supply portions, i.e., more tape feeders can be easily provided in a space having the same width, making it possible to effectively achieve the effect described in the form (1).

(9) The electronic-circuit-component supplying device according to the form (8), further comprising a peeled-carrier-tape twisting device configured to guide, toward a space between the component supply portions belonging to the front row, the peeled carrier tapes each being discharged from the component supply portion belonging to the rear row, while twisting the peeled carrier tape about a center line extending in the longitudinal direction to reduce a width of the peeled carrier tape in the arrangement direction.

Where the configuration in the present form is employed, and the peeled carrier tape is twisted to reduce the width of the peeled carrier tape in the arrangement direction of the component supply portions, it is possible to reduce a width of a space required for passage of the peeled carrier tape and located between the component supply portions adjacent to each other in the forefront row of the component supply portions, making it possible to effectively achieve the effect described in the form (8).

(10) The electronic-circuit-component supplying device according to any one of the forms (2) to (7), wherein the taped-component feeding device is integrally mountable on and removable from the feeder holding device together with the reel holding portion, the component supply portion, and the taped-component guide portion.

(11) A tape feeder configured to feed a taped component in a longitudinal direction of a carrier tape, the taped component having a plurality of component-accommodating recesses arranged at regular pitches in the longitudinal direction and each accommodating an electronic circuit component, the tape feeder being configured to sequentially position the plurality of component-accommodating recesses at a component supply portion, wherein the tape feeder is separable into a first portion and a second portion, the first portion including: a reel holding portion configured to hold a reel on which the taped component is wound; the component supply portion; and a taped-component guide portion configured to guide, to the component supply portion, the taped component drawn from the reel, the second portion including a taped-component feeding device configured to feed the taped component to the component supply portion, and wherein the first portion is a removable mounting unit that is integrally mountable on and removable from the second portion.

Where the first portion is configured as the removable mounting unit integrally mountable on and removable from the second portion, it is possible to reduce the constituent elements of a portion to be mounted and removed, when compared with a case in which the taped-component feeding device and the feeder body are separately mounted and removed as in the conventional tape feeder. This achieves the effect of lowering the equipment cost. Further, since the reel holding portion, the component supply portion, and the taped-component guide portion are integrally mounted on and removed from the second portion, the time required for the changeover of the component supplying device can be reduced, as in the case of the conventional tape feeder, by mounting, onto the second portion, the removable mounting unit on which the taped component is set in advance, and since the components to be mounted and removed have a small shape and a light weight, it is possible to achieve an effect of facilitating a mounting and removing operation.

Directly, this tape feeder is developed for realizing the electronic-circuit-component supplying device in the form (1). The obtained tape feeder, however, achieves the above-described effects even where the tape feeder is used for the electronic-circuit-component supplying device of a type in which the second portions are arranged in a row like the conventional electronic-circuit-component supplying device, and this form is also one embodiment of the invention in the present form.

(12) A removable mounting unit at least comprising:
a reel holding portion configured to hold a reel on which is wound a taped component having a plurality of component-accommodating recesses arranged at regular pitches in a longitudinal direction of a carrier tape and each accommodating an electronic circuit component;
a component supply portion at which the plurality of component-accommodating recesses are sequentially positioned, and the electronic circuit component is taken out from each of the component-accommodating recesses; and
a taped-component guide portion configured to guide, to the component supply portion, the taped component drawn from the reel,
wherein the removable mounting unit is integrally mountable on and removable from a mounting/removing object including a taped-component feeding device configured to feed the taped component, and
wherein the removable mounting unit is enabled to feed the taped component by being mounted on the mounting/removing object.

Directly, the removable mounting unit described in the present form is developed for realizing the electronic-circuit-component supplying device in the form (1). The obtained removable mounting unit, however, achieves the effects explained in relation to the form (11) even where the removable mounting unit is used for the electronic-circuit-component supplying device of a type in which the mounting/removing objects are arranged in a row like the conventional electronic-circuit-component supplying device, and this form is also one embodiment of the invention in the present form.

It is noted that the removable mounting unit described in the present form is used in combination with the component supplying device including the mounting/removing object, but can be manufactured and sold as a product.

(13) The removable mounting unit according to the form (12), further comprising a cover-tape-peeling guide portion configured to guide peeling of a cover tape from the carrier tape of the taped component, the cover tape being for covering the plurality of component-accommodating recesses.

(14) The removable mounting unit according to the form (13), further comprising a cover-tape peeling device including: the cover-tape-peeling guide portion and a cover-tape feeding device configured to apply a tension to the cover tape guided by the cover-tape-peeling guide portion.

Though there has been described that the removable mounting unit comprises the cover-tape feeding device, the cover-tape feeding device has only to be configured such that the main portion of the cover-tape feeding device such as a pair of feed rotary members for feeding the cover tape while nipping opposite sides of the cover tape is provided on the removable mounting unit. A drive source may be provided on the removable mounting unit or on the mounting/removing object. In the former case, a connector for receiving a driving energy such as a current needs to be provided on the removable mounting unit. In the latter case, an engageable/disengageable rotation transmitting portion needs to be provided in a rotation transmitting device.

(15) The removable mounting unit according to any one of the forms (12) to (14), wherein the taped-component guide portion has a passage for the taped component, the passage being formed in a connecting member physically connecting between the reel holding portion and the component supply portion.

Each configuration described in the present form or the following forms is applicable to the electronic-circuit-component supplying device described in any of the forms (1) to (10).

(16) The removable mounting unit according to any one of the forms (12) to (15), further comprising:
a positioning protruding portion configured to position the taped component in a longitudinal direction thereof by being engaged with a perforation of the carrier tape; and
an urging portion configured to urge the positioning protruding portion in a direction in which the positioning protruding portion is engaged with the perforation.

Where the configuration in the present form is employed, the engagement of the positioning protruding portion with the perforation allows the taped component to be positioned in its longitudinal direction, while when an equal to or greater than a specific moving force is applied to the taped component, the positioning protruding portion is disengaged from the perforation against an urging force of the urging portion, allowing the movement of the taped component in its longitudinal direction.

That is, the taped component can be crisply moved at pitches of the perforations. For example, the taped components stopped at a position at which the positioning protruding portion is engaged with the perforation, whereby when the feeding member is moved to the engaged position by the engaging/disengaging device described in the form (4), the protruding portion of the feeding member can be precisely engaged with the perforation.

(17) The removable mounting unit according to the form (14),
wherein the taped-component guide portion has a passage for the taped component, the passage being formed in a connecting member physically connecting between the reel holding portion and the component supply portion; and
wherein the cover-tape peeling device includes:
a peel-back guide portion provided in a horizontal posture on an upper side of the connecting member and configured to guide a peel-back action of the cover tape toward an upstream side in a direction in which the taped component is fed, by being engaged with the cover tape peeled from the carrier tape of the taped component located in the passage;
a cover-tape feeding device provided on a lower side of the connecting member and including a pair of feed rotary members configured to feed the cover tape while nipping a portion of the cover tape from both sides thereof, wherein a widthwise direction of the portion coincides with a horizontal direction; and
a guide face formed by an outer face of a portion of the connecting member which is located between the peel-back guide portion and the cover-tape feeding device, the guide face being configured to guide the cover tape peeled back by the peel-back guide portion, from an upper side of the connecting member toward a lower side thereof in a state in which the cover tape is twisted 90 degrees.

Where the configuration in the present form is employed, the cover tape drawn toward an upper side of the connecting member can be easily guided toward a lower side of the connecting member.

(18) The removable mounting unit according to the form (14) or (17), further comprising a cover tape container configured to accommodate the cover tape peeled by the cover-tape peeling device.

(19) A plurality of kinds of removable mounting units each comprising:
an integral component including:
a taped-component guide portion configured to guide a taped component in a longitudinal direction of a carrier tape, the taped component having a plurality of component-accommodating recesses covered with a cover tape and arranged at regular pitches in the longitudinal direction and each accommodating an electronic circuit component; and
a cover-tape-peeling guide portion configured to guide peeling of the cover tape from the carrier tape of the taped component guided by the taped-component guide portion; and
a combined component to be combined with the integral component in a plurality of kinds of manners, the combined component being at least one of (a) a reel holding portion configured to rotatably hold a reel on which the taped component is wound, (b) a cover-tape feeding device configured to feed the cover tape peeled while being guided by the cover-tape-peeling guide portion, and (c) a cover tape container for containing the cover tape, wherein each of the reel holding portion, the cover-tape feeding device, and the cover tape container has one kind of configuration,
wherein the plurality of kinds of removable mounting units are a plurality of kinds of assemblies combined in the plurality of kinds of manners and integrally mountable on and removable from a mounting/removing object including a taped-component feeding device configured to feed the taped component, and
wherein the plurality of kinds of removable mounting units are enabled to feed the taped component by being mounted on the mounting/removing object.

Where the feature described in the present form is employed, the integral components of the respective kinds and at least one of the reel holding portion, the cover-tape feeding device, and the cover tape container can be used to produce the plurality of kinds of removable mounting units, leading to reduction in production cost by mass production.

(21) The electronic-circuit-component supplying device according to the form (1), wherein the component supply portions of the plurality of tape feeders are arranged along each of the plurality of straight lines and also arranged along a straight line perpendicular to the plurality of straight lines.

Where the configuration described in the present form is employed, the plurality of the component supply portions are completely superposed on one another in a direction perpendicular to the arrangement direction, thereby obtaining the effect described in the form (1) effectively in particular.

(22) The electronic-circuit-component supplying device according to the form (1) or (21), wherein each of the plurality of tape feeders includes:
a plurality of sets of: reel holding portions each configured to hold a reel on which the taped component is wound; the component supply portions; taped-component guide portions each configured to guide, to the component supply portion, the taped component drawn from the reel; and taped-component feeding devices each configured to feed the taped component to the component supply portion; and a feeder body configured to hold the plurality of sets in a state in which the plurality of sets of the component supply portions are arranged in a straight line perpendicular to the plurality of straight lines in one plane, the feeder body being removably held by the feeder holding device.

(23) The electronic-circuit-component supplying device according to the form (22), when, in each of the plurality of tape feeders, a side where the component supply portion is located is called a front side, and a side where the reel holding portion is located is called a rear side, the taped-component feeding devices of the plurality of the sets are arranged in a front and rear direction.

(24) The electronic-circuit-component supplying device according to the form (23),
wherein each of the plurality of tape feeders is provided in a posture in which the tape feeder extends horizontally, and
wherein each of the taped-component guide portions which belongs to a pair in which the taped-component feeding device is provided on a front side among the plurality of pairs is provided so as to extend on a lower side of the taped-component feeding device provided on a rear side.

(25) The electronic-circuit-component supplying device according to any one of the forms (22) to (24),
wherein each of the plurality of tape feeders is provided in a posture in which the tape feeder extends horizontally,
wherein each of the pairs includes a second guide portion in addition to the reel holding portion, the component supply portion, and the taped-component guide portion and the taped-component feeding device as a first guide portion, the second guide portion being configured to guide a peeled carrier tape that is the carrier tape from which the electronic circuit component has been taken out at the component supply portion, and
wherein each of the second guide portions is provided on a lower side of a corresponding one of the first guide portions.

Where the configuration described in the present form is employed, the carrier tape holding the component and fed forward is moved so as to make a U-turn after the component is taken out, whereby both of a supply of the taped component and a discharge of the peeled carrier tape can be performed at a rear of the component supply portion, the first guide portion, and the second guide portion.

(26) The electronic-circuit-component supplying device according to any one of the forms (22) to (25), wherein each of the pairs includes a cover-tape peeling device in addition to the reel holding portion, the component supply portion, the taped-component guide portion, and the taped-component feeding device, the cover-tape peeling device being configured to peel the cover tape for covering the plurality of component-accommodating recesses of the carrier tape, such that the cover tape is peeled back from the carrier tape toward an upstream side in a direction in which the carrier tape is fed.

(27) The electronic-circuit-component supplying device according to the form (26),
wherein each of the plurality of tape feeders is provided in a posture in which the tape feeder extends horizontally,
wherein, when, in each of the plurality of tape feeders, a side where the component supply portion is located is called a front side, and a side where the reel holding portion is located is called a rear side, the cover-tape peeling device corresponding to the component supply portion belonging to a front row is provided on a lower side of the cover-tape peeling device corresponding to the component supply portion belonging to a rear row, and
wherein the cover tape peeled by the cover-tape peeling device corresponding to the component supply portion belonging to the front row is moved, in a posture in which the cover tape is twisted 90 degrees, from an upper side to a lower side of the cover-tape peeling device corresponding to the component supply portion belonging to the rear row.

(28) The electronic-circuit-component supplying device according to the form (26),
wherein each of the plurality of tape feeders is provided in a posture in which the tape feeder extends horizontally,
wherein, when, in each of the plurality of tape feeders, a side where the component supply portion is located is called a front side, and a side where the reel holding portion is located is called a rear side, the cover-tape peeling device corresponding to the component supply portion belonging to a front row peels the cover tape along a passage extending on an upper side of the cover-tape peeling device corresponding to the component supply portion belonging to the rear row.

The plurality of the cover-tape peeling devices respectively corresponding to the plurality of the component supply portions held by the one feeder body are superposed on one another in an up and down direction. Thus, the provision of the plurality of the cover-tape peeling devices makes it possible to avoid an increase in the width of the tape feeder.

(29) The electronic-circuit-component supplying device according to any one of the forms (26) to (28), wherein each of the pairs further includes a cover tape container configured to accommodate the cover tape peeled by the cover-tape peeling device.

In a form in which the present form depends on the form (28), the cover-tape peeling device corresponding to the component supply portions belonging to the front row is preferably configured to peel the cover tape along a passage extending on an upper side of the cover-tape peeling device and the cover tape container corresponding to the component supply portion belonging to the rear row. Alternatively, the cover tape container corresponding to the component supply portion belonging to the front row is preferably provided on an upper side of the cover tape container corresponding to the component supply portion belonging to the rear row.

(30) The electronic-circuit-component supplying device according to any one of the forms (21) to (29), wherein the reel holding portions of each of the plurality pairs are arranged so as to be displaced from each other in an up and down direction.

(31) The electronic-circuit-component supplying device according to the form (1),
wherein each of the plurality of tape feeders includes:
a reel holding portion configured to hold a reel on which the taped component is wound;
the component supply portion;
a taped-component guide portion configured to guide, to the component supply portion, the taped component drawn from the reel,
a taped-component feeding device configured to feed the taped component to the component supply portion; and
a feeder body configured to hold the reel holding portion, the component supply portion, the taped-component guide portion, and the taped-component feeding device, and
wherein the feeder holding device is configured to hold the plurality of tape feeders in a state in which the component supply portions of the plurality of tape feeders are arranged in a plurality of rows in the one plane and in an arrangement direction along each of the plurality of straight lines extending parallel to each other.

Where the feeder holding device is configured to hold the plurality of tape feeders in the state in which the component supply portions of the plurality of tape feeders are arranged in a plurality of rows in the one plane and in an arrangement direction along each of the plurality of straight lines extending parallel to each other, many tape feeders can be held by the feeder holding device having a limited width when compared with a case in which the plurality of tape feeders are arranged in a row as in the conventional technique.

A form in which the feeder holding device holds the tape feeder in a posture in which the tape feeder extends in the up and down direction or in a direction inclined with respect to the up and down direction, and the component supply portion is provided on an upper end portion of the tape feeder is one form of the component supplying device described in the present form.

As another form, it is possible to provide the following configuration. One tape feeder extends horizontally as in the conventional technique, and each of the other tape feeders extends in the horizontal direction, and its front end portion extends in the up and down direction or in the direction inclining with respect to the up and down direction. Further, an upper end of each of the other tape feeders is positioned at the same height as an upper face of the above-described one tape feeder, and the component supply portions are provided on the respective other tape feeders at the same height position.

(32) The electronic-circuit-component supplying device according to the form (31), wherein the feeder holding device is configured to hold a plurality of first feeders and a plurality of second feeders in a state in which the plurality of first feeders are arranged in a direction parallel to the arrangement direction to form a first feeder row, and the plurality of second feeders are arranged in the direction parallel to the arrangement direction to form a second feeder row.

Equal to or more than three feeder rows may be formed.

(33) The electronic-circuit-component supplying device according to the form (32), wherein the feeder holding device is configured to hold the plurality of first feeders and the plurality of second feeders in a state in which the first feeder row is located on an upper side of the second feeder row, and wherein each of the plurality of second feeders has a second feeder body having a shape in which a front end portion thereof extends in a direction having a component of the up and down direction, and the component supply portions are provided at the same height respectively on an upper end of the front end portion of the second feeder and an upper end of a first feeder body of the first feeder.

As described in the explanation for the form (31), the feeder holding device can be configured to hold the feeders in a state in which the first feeder row and the second feeder row are arranged in the horizontal direction. However, the configuration in the present form is preferable from a viewpoint of an easiness of an operation to mount and remove the first and second feeders on and from the feeder holding device.

(34) The electronic-circuit-component supplying device according to the form (33), wherein the feeder holding device includes:

a first feeder holding table including a plurality of first holding portions for respectively supporting the plurality of first feeders from a lower side thereof to removably hold the plurality of first feeders; and a second feeder holding table provided on a lower side of the first feeder holding table and including a plurality of second holding portions for respectively supporting the plurality of second feeders from a lower side thereof to removably hold the plurality of second feeders.

Where the configuration in the present form is employed, the first feeder and the second feeder can be mounted on respective upper faces of the first feeder holding table and the second feeder holding table, making it possible to achieve the effect of facilitating the operation for mounting and removing the feeder.

However, the second feeder needs to be provided in a space between the first feeder holding table and the second feeder holding table. Further, since the second feeder body has the shape in which the front end portion thereof extends in the direction having the component of the up and down direction, the second feeder body needs to be mounted onto the second feeder holding table from a front side thereof or needs to be pivotable to the posture in which the front end portion extends horizontally as described in forms (37) and (38), for example.

Where the former measure is employed, the first and second feeder holding tables are provided on a wheeled table, and the second feeder is mounted onto the second feeder holding table in a state in which the wheeled table is located distant from a main body of the component mounting machine, for example. Where the latter measure is employed, the second feeder can be mounted from a rear side.

(36) The electronic-circuit-component supplying device according to the form (34), wherein the feeder holding device includes a feeder holding member including: a plurality of first holding portions respectively for removably holding the plurality of first feeders from a lower side thereof on respective upper faces of the plurality of first holding portions; and a plurality of second holding portions respectively for removably holding the plurality of second feeders from an upper side thereof on respective lower faces of the plurality of second holding portions.

Where the configuration in the present form is employed, the second feeder including the second feeder body having the shape in which the front end portion extends in the direction having the component of the up and down direction can be mounted onto the feeder holding member without any changes in shape.

(37) The electronic-circuit-component supplying device according to the forms (31) to (36), wherein the second feeder body as a main body of each of the plurality of second feeders includes: the main portion; and a pivot portion held by the main portion so as to be pivotable about an axis parallel to the arrangement direction, and wherein the component supply portion is provided on the pivot portion.

(38) The electronic-circuit-component supplying device according to the form (37), wherein each second feeder includes a posture keeping device configured to keep the pivot portion selectively at one of: a first posture in which the pivot portion is pivoted upward, and the component supply portion provided on the pivot portion is located in the same plane as the component supply portion of the first feeder; and a second posture in which the pivot portion extends straight from the main portion.

(39) The electronic-circuit-component supplying device according to any one of the forms (31) to (38), wherein each of the plurality of tape feeders includes a cover-tape peeling device in addition to the reel holding portion, the component supply portion, the taped-component guide portion, and the taped-component feeding device, the cover-tape peeling device being configured to peel the cover tape for covering the plurality of component-accommodating recesses of the carrier tape, such that the cover tape is peeled back from the carrier tape toward an upstream side in a direction in which the carrier tape is fed.

(41) The electronic-circuit-component supplying device according to any one of the forms (1) to (12), (21) to (25), and (31) to (38), further comprising a half-peeling device configured to keep a state in which a cover tape for covering the plurality of component-accommodating recesses of the carrier tape of the taped component fed by the taped-component feeding device is fastened to the carrier tape at a side portion located on one side of the row of the component-accommodating recesses, and configured to establish a state in which a central portion of the cover tape which covers the row of the component-accommodating recesses and a side portion of the cover tape which is located on the other side from the fastening portion stand up so as to expose upper portions of the component-accommodating recesses.

Where the configuration described in the present form is employed, the cover tape can be returned to an original state in which the cover tape is fastened to the carrier tape, after the component-accommodating recess is exposed, and the component is taken out. This makes it possible to dispose of the cover tape together with the peeled carrier tape, eliminating the need for providing a device specifically for disposing of the cover tape such as the cover-tape peeling device and the cover tape container. This facilitates realizing the configuration described in the form (1).

BRIEF DESCRIPTION OF THE DRAWINGS

FIGS. 11A-11C are views each showing a part of the main-body member of the tape feeder group, wherein FIG. 11A is a plan view thereof, FIG. 11B is a cross-sectional view taken along line b-b in FIG. 11A, and FIG. 11C is a cross-sectional view taken along line c-c in FIG. 11A.

EMBODIMENTS

Hereinafter, there will be described embodiments of the claimable invention by reference to the above-described drawings. It is to be understood that the claimable invention is not limited to the embodiments described below, and may be otherwise embodied with various changes and modifications, such as those described in the foregoing "FORMS OF THE INVENTION", which may occur to those skilled in the art.

Figure 1:
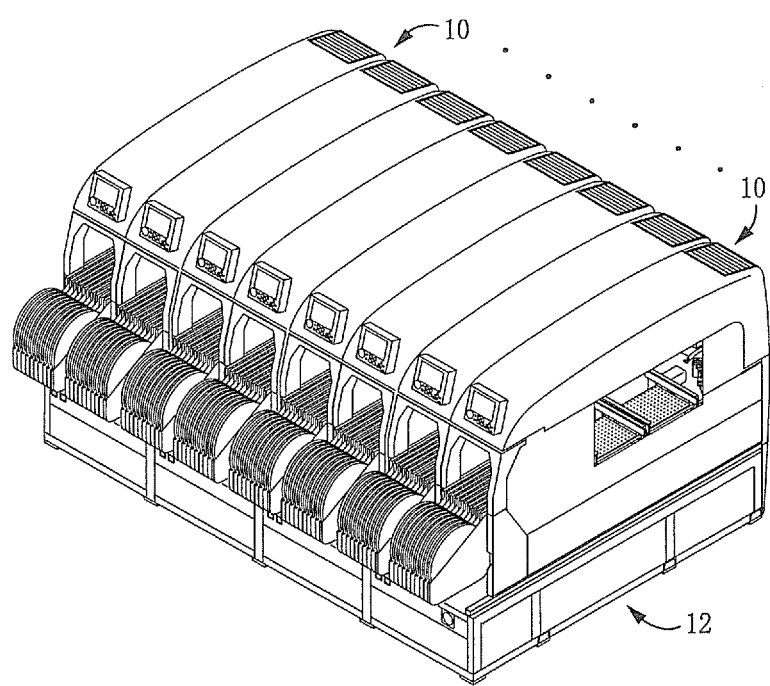
FIG. 1 is a perspective view showing an external appearance of a mounting system on which is provided a component supplying device as one embodiment of the claimable invention.

FIG. 1 shows the external view of the mounting system. The present mounting system is constituted by a plurality of mounting modules 10, each two of which are arranged side by side as a pair and fixed to a base 12 that is common to the mounting modules 10. The pairs of the mounting modules 10 are arranged side by side. The mounting modules 10 each serves as an electronic-circuit-component mounting machine and perform mountings of electronic circuit components onto circuit substrates in parallel such that one mounting is divided among the mounting modules 10.

JP-A-2004-104075 discloses a detail construction of the mounting module 10, for example. Thus, there will be simply explained a construction of the mounting module 10 other than its construction relating to the claimable invention.

Figure 2:
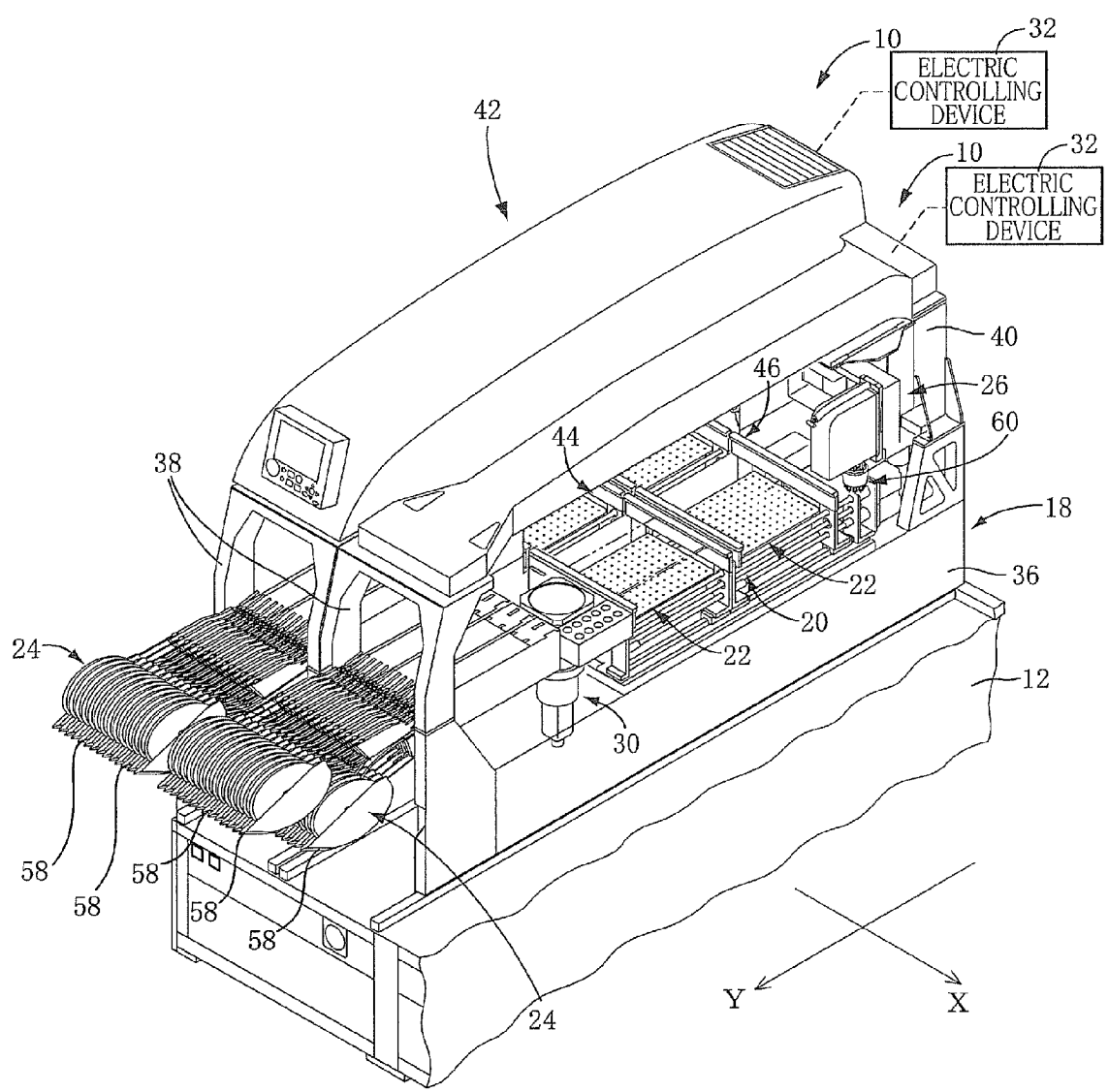
FIG. 2 is a perspective view showing a construction of a mounting module as one component of the mounting system, with illustration of a cover of the mounting module being partly omitted.

As shown in FIG. 2, each mounting module 10 includes a module body 18 as a main-body frame, a substrate conveyor device 20, substrate holding devices 22, a component supplying device 24, a component mounting machine 26, a fiducial-mark imaging device 28 (see FIG. 3), a component imaging device 30, and an electric controlling device 32.

As shown in FIG. 2, the module body 18 includes: a bed 36 elongated in a front and rear direction; two front columns 38 and two rear columns 40 standing respectively on front and rear end portions of the bed 36; and a crown 42 supported by the four columns 38, 40.

As shown in FIG. 2, the substrate conveyor device 20 including two substrate conveyors 44, 46 is provided on a central portion of the bed 36 in the front and rear direction. The substrate conveyor device 20 is configured to convey the circuit substrates in its horizontal posture in a conveying direction that is a horizontal direction parallel to a direction in which the mounting modules 10 are arranged. The substrate holding devices 22 are provided for the two substrate conveyors 44, 46, respectively. Each of the substrate holding devices 22 includes: a support member for supporting each circuit substrate from a lower side thereof, and a clamp member for clamping opposite edge portions of the circuit substrate in a direction parallel to the conveying direction. The substrate holding device 22 holds the circuit substrate in a posture in which a mounting surface thereof on which the electronic circuit components are to be mounted is horizontal. The conveying direction in which the substrate conveyor device conveys the circuit substrate is defined as an X-axis direction, while a direction perpendicular to the X-axis direction in a horizontal plane that is a plane parallel to the mounting surface of the circuit substrate held by the substrate holding device 22 is defined as a Y-axis direction.

Figure 4:
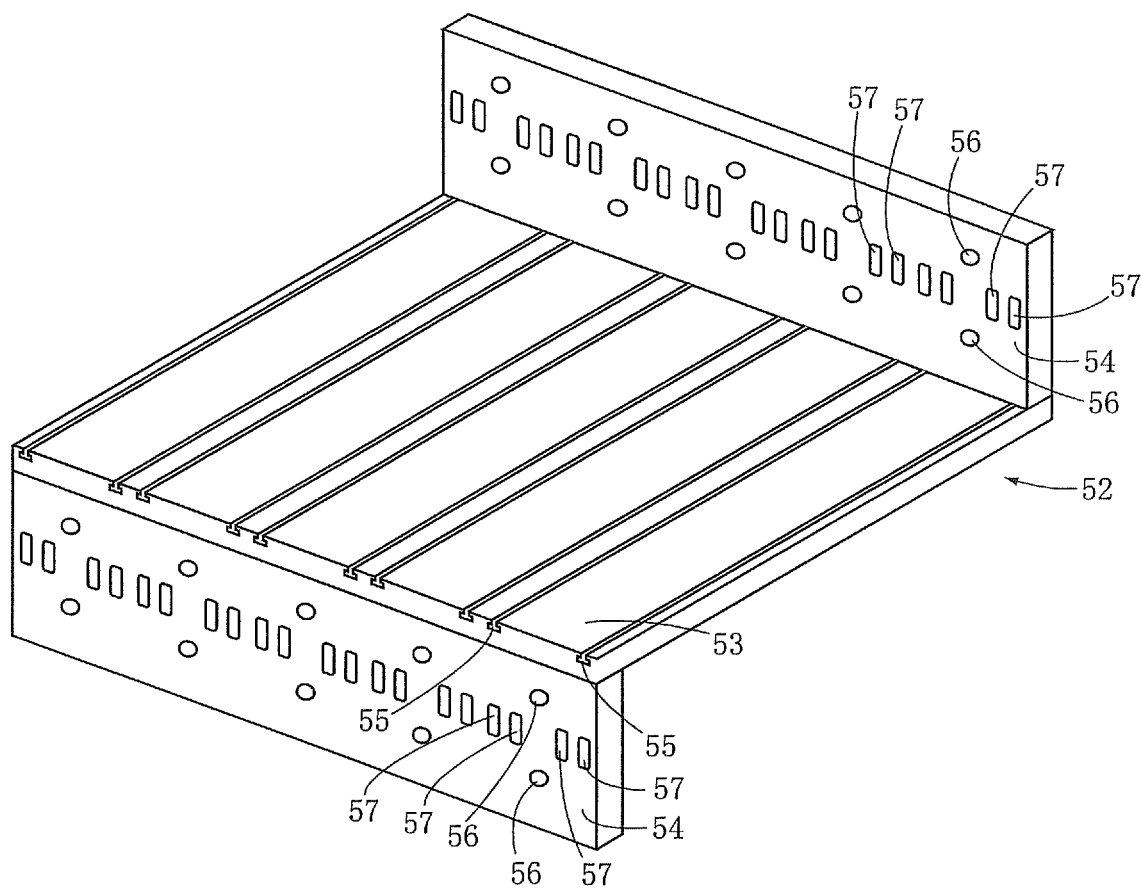
FIG. 4 is a perspective view showing a feeder holding table as one component of the component supplying device.

The component supplying device 24 is provided on one side of the substrate conveyor device 20 on the bed 36 in the Y-axis direction and near a front face of the mounting module 10. The component supplying device 24 includes a feeder holding table 52 shown in FIG. 4 as a feeder holding device. The feeder holding table 52 includes: a flat support plate 53; a connection wall 54 standing upright on one end portion of the support plate 53; and a connection wall 54 extending downward from the other end portion of the support plate 53. A plurality of T-shaped grooves 55 (positioning grooves) as a plurality of positioning portions are formed parallel to one another in the support plate 53. Provided in and on each of the connection wall 54 are a plurality of pairs of positioning holes 56 each as a first positioning portion and a plurality of connectors 57 as a plurality of connecting portions. As shown in FIG. 2, a plurality of tape feeders (hereinafter abbreviated as "feeders") 58 which will be described below are held on the feeder holding table 52, thereby constituting the component supplying device 24. The component supplying device may include a portion for supplying the electronic circuit components by using a tray. The feeder holding table 52 is mountable on and removable from the bed 36. Further, the feeder holding table 52 is replaceable with another feeder holding table whose arrangement of the T-shaped grooves 55, the positioning holes 56, and the connectors 57 is different from that of the components 55, 56, 57 of the feeder holding table 52, and is replaceable with a feeder holding table for supporting conventional tape feeders replaceably.

Figure 3:
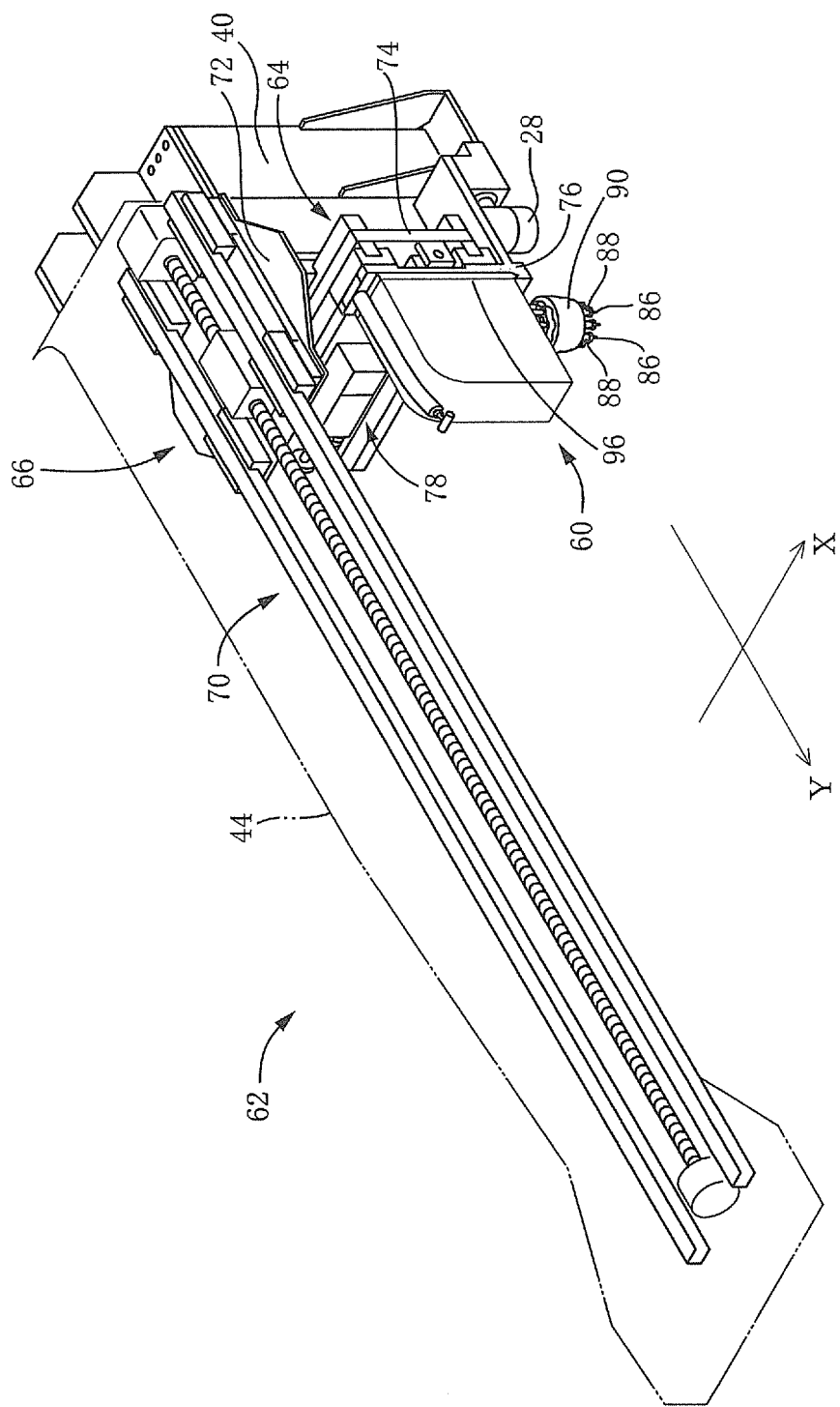
FIG. 3 is a perspective view showing a component mounting machine of the mounting module.

As shown in FIGS. 2 and 3, the component mounting machine 26 includes a mounting head 60 and a head moving device 62 for moving the mounting head 60. As shown in FIG. 3, the head moving device 62 includes an X-axis-direction moving device 64 and a Y-axis-direction moving device 66. The Y-axis-direction moving device 66 includes a linear motor 70 provided on the crown 42 constituting the module body 18, such that the linear motor 70 extends over a component supply portion of the component supplying device 24 and the substrate holding devices 22. The Y-axis-direction moving device 66 is configured to move a Y-axis slide 72 as a movable member to any position in the Y-axis direction. The X-axis-direction moving device 64 is provided on the Y-axis slide 72 and moved in the X-axis direction with respect to the Y-axis slide 72. The X-axis-direction moving device 64 includes: first and second X-axis slides 74, 76 moved relative to each other in the X-axis direction; and an X-axis-slide moving devices 78 for moving the slides 74, 76 in the X-axis direction (noted that FIG. 3 shows only a moving device for moving the first X-axis slide 74). Each of the two X-axis-slide moving devices includes: a servomotor which is a rotary electric motor provided as a drive source; and a feed screw mechanism including a ball screw and a nut, for example. Each X-axis-slide moving device is configured to move a corresponding one of the X-axis slide 74, 76 to any position in the X-axis direction.

The mounting head 60 is replaceably mounted on the second X-axis slide 76 and moved by the head moving device 62 to any position within a mounting working area that is a moving area extending over the component supply portion of the component supplying device 24 and the substrate holding devices 22. The mounting head 60 is for holding the electronic circuit components by using suction nozzles 86 as component holders. A plurality types of the mounting heads 60 respectively having different numbers of nozzle holders each for holding the suction nozzles 86 as a holder holding portion are prepared, and one of the mounting heads 60 is selectively mounted on the second X-axis slide 76 according to a type of the circuit substrate on which the electronic circuit components are to be mounted. Although not shown, each of nozzle holders 88 is provided on a head main body of the mounting head 60 so as to be movable in an axial direction and a vertical direction and rotatable about an axis of the nozzle holder 88 itself. Each nozzle holder 88 is raised/lowered and rotated by a raising and lowering device and a rotating device each as a moving device provided on the head main body.

The nozzle holders 88 are turned by rotation of a rotary body 90 about a rotation axis of the rotary body 90 and each sequentially moved to and stopped at a component suction-mounting position as one of a plurality of working positions. Each nozzle holder 88 is then lowered and raised by the raising and lowering device, not shown, provided on the head main body at a position corresponding to the component suction-mounting position. Each of the nozzle holders 88 is rotated about its axis by a holder rotating device provided on the head main body. It is noted that, as shown in FIG. 3, the fiducial-mark imaging device 28 is mounted on the second X-axis slide 76 and moved together with the mounting head 60 by the head moving device 62.

There will be next explained the component supplying device 24 in detail.

The component supplying device 24 includes the feeder holding table 52 and a plurality of feeder assemblies 100 (see FIG. 5) which are mounted on and removed from the feeder holding table 52. Each of the feeder assemblies 100 includes a plurality of the feeders 58 (eight feeders in the illustrated example). Each of the feeders 58 can be separated into first portions 102, 104 and second portions 106, 108. As shown in FIG. 6B, the first portion 102 includes a component supply portion 110, a reel holding portion 112, a taped-component guide portion 114, a cover-tape peeling device 116, and a cover tape container 118. As shown in FIG. 6A, the first portion 104 also includes a component supply portion 110, a reel holding portion 112, a taped-component guide portion 114, a cover-tape peeling device 116, a cover tape container 118, but the cover-tape peeling device 116 and the cover tape container 118 as an integral component are fixed to the component supply portion 110 and the taped-component guide portion 114 as another integral component in an inverted orientation with respect to the first portion 102. That is, in the first portion 102, the cover-tape peeling device 116 and the cover tape container 118 as the integral component are fixed to a lower face of the taped-component guide portion 114 and the component supply portion 110 as the integral component in an inverted state, while in the first portion 104, the cover-tape peeling device 116 and the cover tape container 118 as the integral component are fixed to an upper face of the taped-component guide portion 114 and the component supply portion 110 as the integral component in a correct state. It is noted that the reel holding portions 112 are fixed to the respective cover tape containers 118 in the same construction and in the same orientation in both of the first portion 102 and the first portion 104, but heights of the respective two reel holding portions 112 are different from each other in the vertical direction because the cover tape containers 118 face opposite directions as described above. Therefore, it is possible to consider that the integral components respectively constituted by the cover-tape peeling devices 116 and the cover tape containers 118 and having the same construction, and the cover tape containers 118 having the same construction are fixed in the different states, thereby constituting two types of the integral components each including the reel holding portion 112, the cover-tape peeling device 116, and the cover tape container 118, and these two types of the integral components are fixed respectively to the integral components respectively constituted by the component supply portions 110 and the taped-component guide portions 114 in the different states, thereby constituting two types of the first portions 102, 104.

In any case, manners of the fixation of the plurality of components that are mutually different from one another are made different from each other to provide the first portions 102, 104 of the two types, leading to reduction in cost by mass production.

Meanwhile, the eight second portions constituted by the four second portions 106 and the four second portions 108 share a main-body member 120. Thus, the eight feeders 58 can be mounted or removed all together by mounting or removing the main-body member 120 on or from the feeder holding table 52. The main-body member 120 is mounted on the feeder holding table 52 by fitting protruding portions 122 each provided on the main-body member 120 so as to have a T-shape in cross section, into the respective T-shaped grooves 55 of the feeder holding table 52 and by fitting a connector 128 as a connecting portion and positioning pins 125, 126 as positioning portions provided at two portions on the main-body member 120, into the positioning holes 56 and the connectors 57 of the feeder holding table 52.

Figure 5:
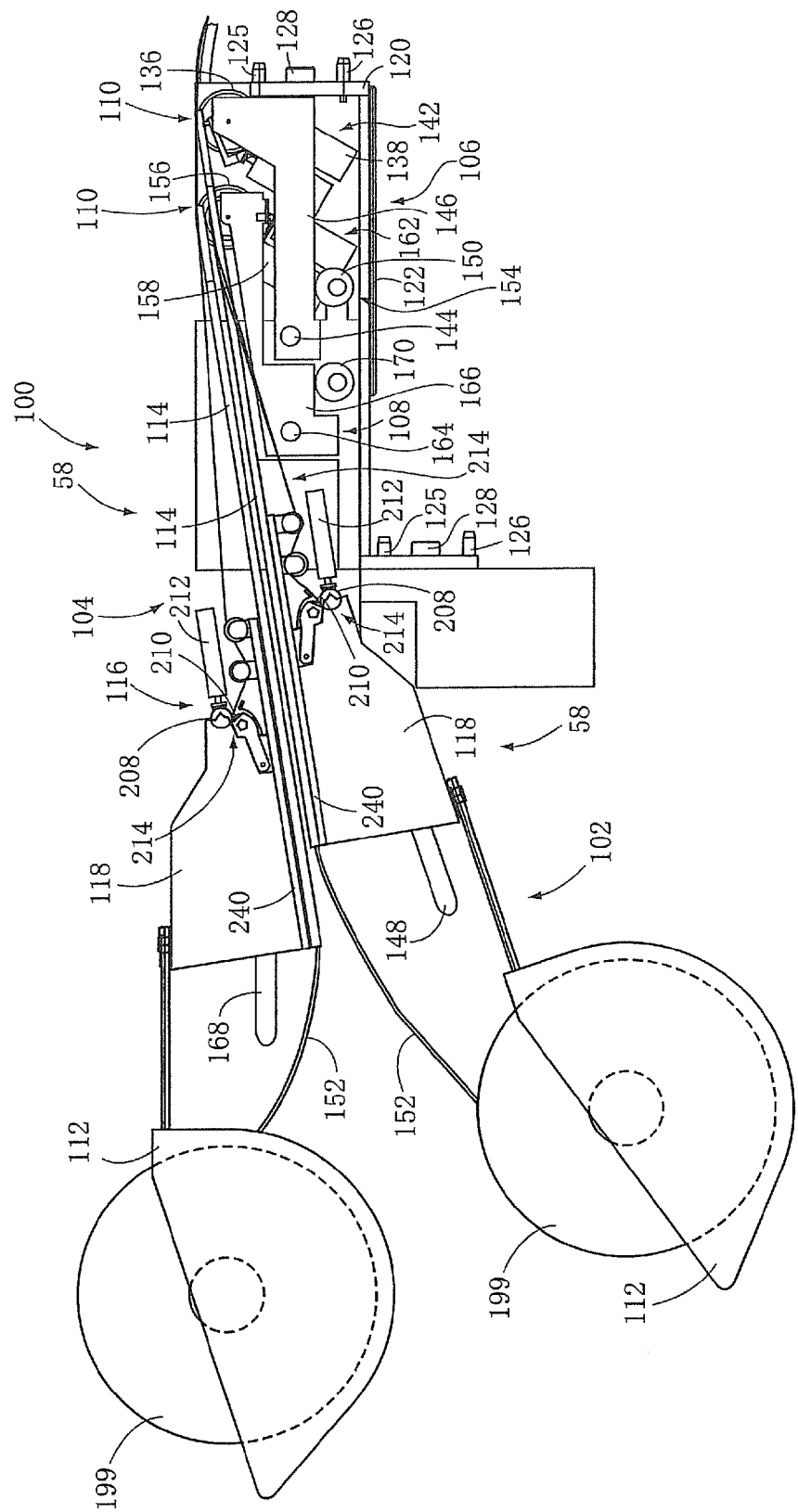
FIG. 5 is a side view showing a tape feeder group that is mounted on and removed from the feeder holding table, with illustration of a side plate and a main-body member being partly omitted for the purpose of easier understanding of an internal construction of the tape feeder group.
Figure 6:
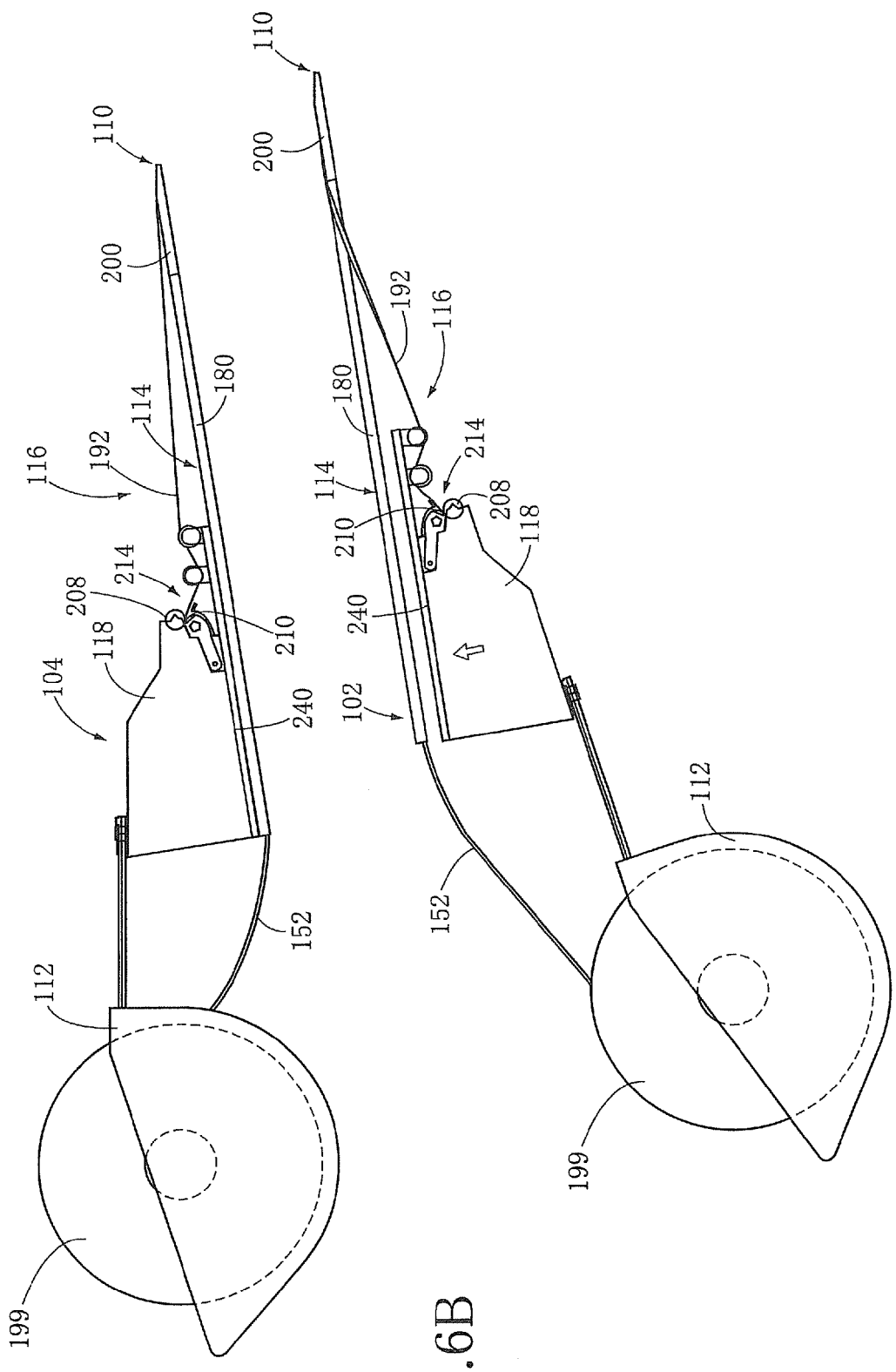
FIGS. 6A and 6B are side views showing two types of removable mounting units, where each removable mounting unit represents one component of the tape feeder group.
Figure 7:
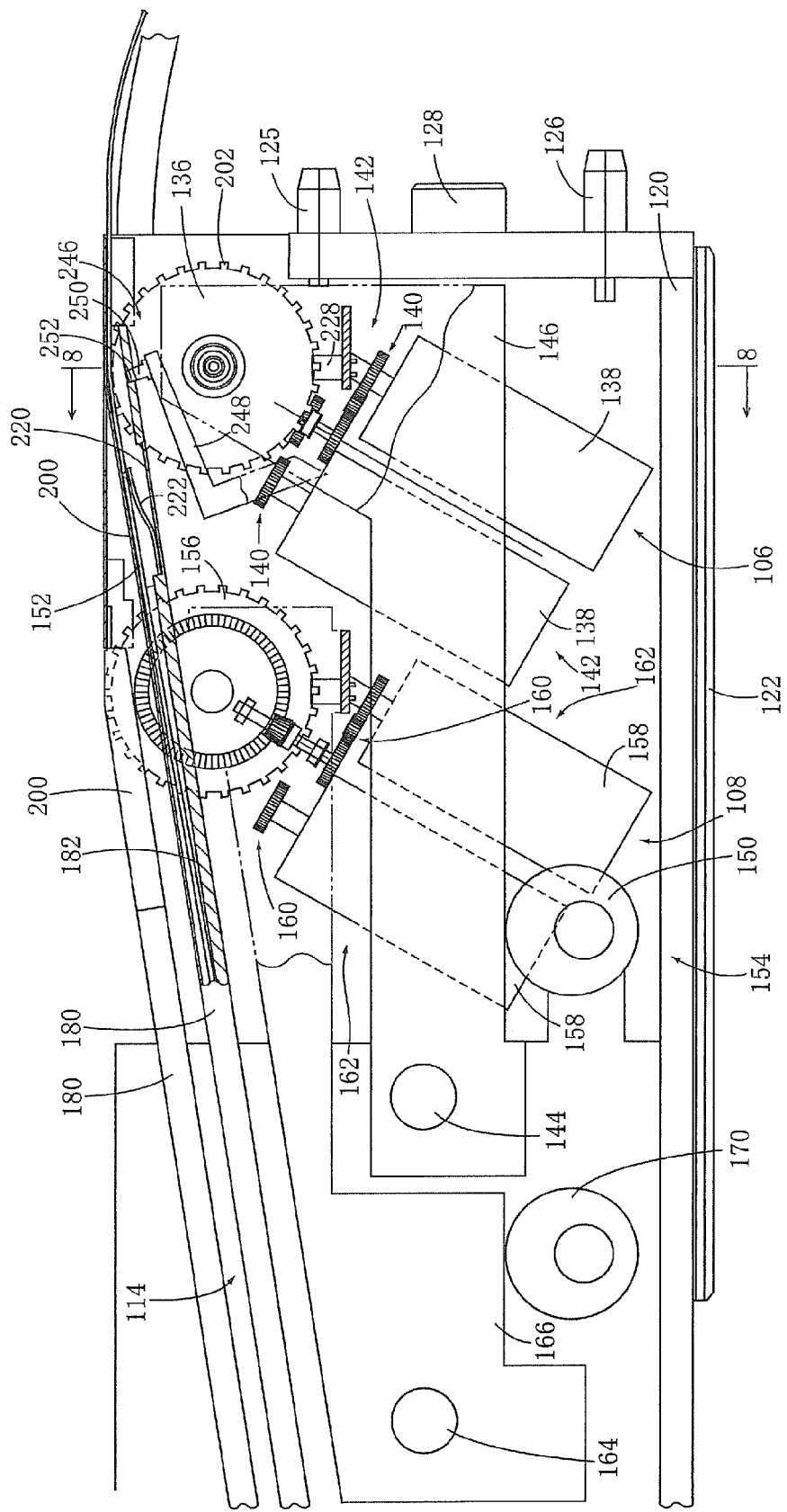
FIG. 7 is an enlarged side view partly showing the tape feeder group, a part of which is illustrated in cross section.
Figure 8:
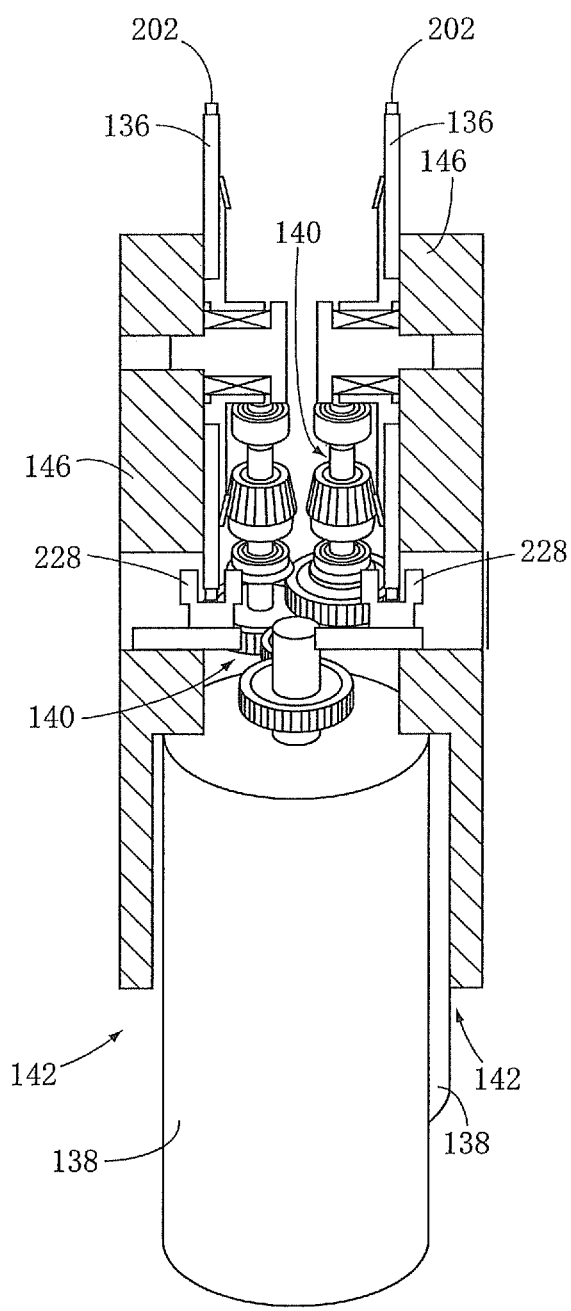
FIG. 8 is a cross-sectional view taken along line 8-8 in FIG. 7.

As shown in FIGS. 5, 7, and 8, each of the second portions 106 which constitutes one feeder 58 with the first portion 102 includes a taped-component feeding device 142 including: a sprocket 136 as a feeding member; an electric motor 138 having a speed reducer as a drive source; and a rotation transmitting mechanism 140. This taped-component feeding device 142 is held by a pivot arm 146 that is pivotably supported by the main-body member 120 via a support shaft 144. A cam 150 (an eccentric cam in the illustrated example) rotated by an operation of an operating lever 148 moves the taped-component feeding device 142 between an engaged position at which the sprocket 136 is engaged with a taped component 152 and a disengaged position at which the sprocket 136 is disengaged and distant from the taped component 152. Though illustration and explanation for an interlock device for interlocking between the operating lever 148 and the cam 150 are omitted, the interlock device is configured such that the pivot arm 146 is pivoted to the engaged position when the operating lever 148 is pushed down, whereby an engaging/disengaging device 154 is constituted by the operating lever 148, the interlock device, the cam 150, and the pivot arm 146.

It is noted that, as most clearly shown in FIGS. 7 and 8, in the taped-component feeding devices 142 of the two first portions 102 next to each other, positions of the two electric motors 138 are displaced from each other in the front and rear direction. Thus, arrangements of the components of the two rotation transmitting mechanisms 140 are different from each other, but the components themselves are the same between the two rotation transmitting mechanisms 140.

Likewise, each of the second portions 108 which constitutes one feeder 58 with the first portion 104 includes a taped-component feeding device 162 including: a sprocket 156; an electric motor 158; and a rotation transmitting mechanism 160. This taped-component feeding device 162 is held by a pivot arm 166 pivotably supported by a main-body member 130 via a support shaft 164. A cam 170 (an eccentric cam in the illustrated example) rotated by an operation of an operating lever 168 moves the taped-component feeding device 142 between an engaged position and a disengaged position. The taped-component feeding device 162 of the second portion 108 is located at a rear of the taped-component feeding device 142 of the second portion 106.

It is noted that, for the mounting module 10, a "front side" is defined as a front left side in FIG. 2 as described above, but for the component supplying device 24, a "front side" is defined as a rear right side in FIG. 2, i.e., a downstream side in a direction in which the taped component is fed by the feeder 58. That is, it is considered that the component mounting machine 26 and the component supplying device 24 of the mounting module 10 face each other.

There will be next explained the first portions 102, 104 in detail. Since the first portions 102, 104 have substantially the same construction as described above, the following explanation is given only for the first portion 102.

Figure 9:
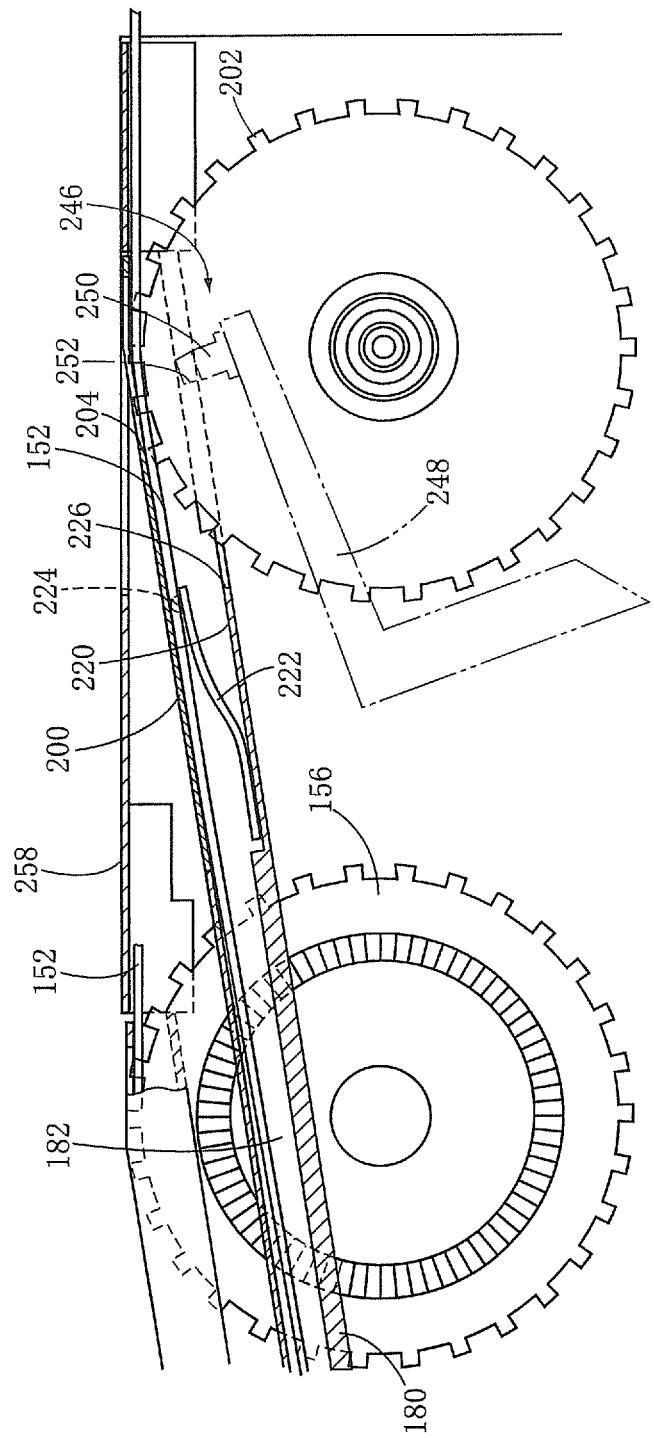
FIG. 9 is an enlarged view partly showing the tape feeder group in cross section different from that in FIG. 7.

As shown in FIGS. 7 and 9, the taped-component guide portion 114 of the first portion 102 is constituted by a square pipe 180 having a rectangular and straight cross section. A thickness of a bottom wall of this square pipe 180 is greater than that of its side wall or upper wall. The square pipe 180 has a passage 182 formed therein for allowing the taped component 152 to pass through the passage 182. In the present embodiment, the taped-component guide portion 114 serves as a straight guide portion, and the square pipe 180 serves as a connecting member for connecting between the component supply portion 110 and the reel holding portion 112.

Figure 13:
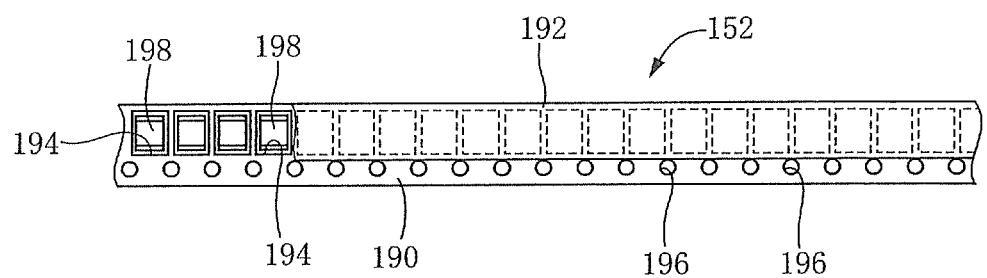
FIG. 13 is a plan view showing a taped component 152 fed by each tape feeder of the tape feeder group.

As shown in FIG. 13, the taped component 152 includes a carrier tape 190 and a cover tape 192 each formed of a synthetic resin. The carrier tape 190 includes an elongated member having a relatively large thickness, in which a plurality of component-accommodating recesses 194 are formed at first pitches, and a plurality of perforations 196 are formed at second pitches. Components 198 are accommodated into the component-accommodating recesses 194, respectively, and then the cover tape 192 is adhered to the carrier tape 190, thereby preventing the components 198 from dropping from the respective component-accommodating recesses 194. Thus, the taped component 152 has a flat and rectangular shape in transverse cross section, and the passage 182 has a rectangular shape in transverse cross section which is greater in thickness than the taped component 152 but does not allow the taped component 152 to rotate about a center line extending in a longitudinal direction of the taped component 152. The taped component 152 is wound on a reel 199 rotatably held by the reel holding portion 112 shown in FIG. 5, in a state in which the cover tape 192 faces outward.

Figure 10:
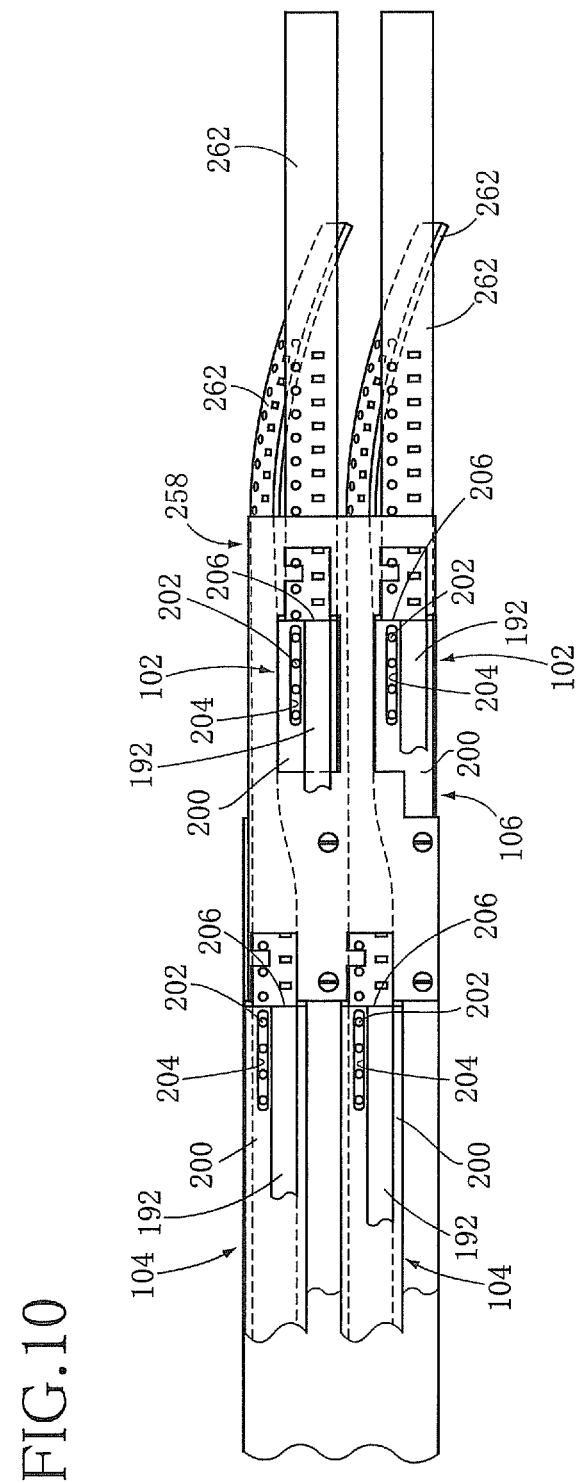
FIG. 10 is a plan view showing a part of the tape feeder group.

As most clearly shown in FIG. 9, at a distal end portion of the square pipe 180, an upper wall is removed, and an outer face of opposite side walls are made thinner by cutting or grinding. The distal end portion is covered with a cover 200 having a three-sided rectangular shape in cross section. An upper wall of a front half portion of the cover 200 is inclined with respect to the upper wall of the square pipe 180 so as to be lower at its front end than at its rear end, and, as shown in FIG. 5, is made horizontal in a state in which the taped-component guide portion 114 is inclined so as to be higher at its front portion than at its rear portion. As shown in FIG. 10, an opening 204 having an elongated-hole shape for allowing entrance of a plurality of protruding portions 202 provided on an outer circumferential face of the sprocket 136 is formed so as to extend over the horizontal portion and the inclined portion next thereto. One of the protruding portions 202 is engaged with a corresponding one of the perforations 196 of the carrier tape 190 at a position corresponding to an inside of the opening 204, and the sprocket 136 is rotated in this state to feed the taped component 152 in its longitudinal direction. In this operation, the cover tape 192 of the taped component 152 is peeled back from the carrier tape 190 toward an upstream side thereof in the direction in which the taped component 152 is fed, in a state in which the cover tape 192 is engaged with a front edge 206 of the above-described horizontal portion. The front edge 206 serves as a peel-back guide portion as a kind of a cover-tape-peeling guide portion.

As shown in FIGS. 6A and 6B, the cover tape 192 peeled as described above is nipped between feed gears 208, 210 as a pair of feed rotary members. When one of the feed gears 208, 210 is rotated by an electric motor 212, an appropriate tension is applied to the cover tape 192, and the cover tape 192 is pushed into the cover tape container 118. It is noted that the electric motor 212 is held near the second portions 106, 108 (specifically, mounted on the main-body member 120 by a bracket, not shown), and when each of the first portions 102, 104 is mounted on the corresponding one of the second portions 106, 108, a bevel gear fixed to the feed gear 208 is meshed with a bevel gear fixed to an output shaft of the electric motor 212, thereby establishing a state in which the rotation of the electric motor 212 is transmitted to the feed gear 208. The pair of these bevel gears serve as engageable/disengageable rotation transmitting portions, and the electric motor 212, the rotation transmitting portions, and the gears 208, 210 constitute a cover-tape feeding device 214. This cover-tape feeding device 214 and the front edge 206 as the cover-tape-peeling guide portion cooperate to constitute the cover-tape peeling device 116.

The front edge 206 of the above-described horizontal portion is located near an upper face of the square pipe 180, while the above-described cover-tape feeding device 214 is provided on a lower side of the square pipe 180. Thus, the cover tape 192 is initially peeled from the carrier tape 190 in its horizontal posture, but twisted 90 degrees between the front edge 206 and the cover-tape feeding device 214, then moved in its vertical posture along a side face of the square pipe 180 as a guide face, then twisted 90 degrees again to be returned to its horizontal posture, and then nipped between the feed gears 208, 210. As a result, a space having a width slightly greater than a thickness of the cover tape 192 allows the cover tape 192 to be moved from an upper side toward a lower side of the taped-component guide portion 114.

As described above, the cover tape 192 is peeled from the carrier tape 190 in the state in which the cover tape 192 is engaged with the front edge 206 of the cover 200 fixed to the square pipe 180. Thus, each of the component-accommodating recesses 194 located downstream of the front edge 206 of the cover 200 establishes an open state, making it possible for a corresponding one of the components 198 to be picked up. Therefore, in the present embodiment, a vicinity portion of the front edge 206 of the taped-component guide portion 114 constituted by the square pipe 180 and the cover 200 is the component supply portion 110.

As shown in FIG. 9, a recess 220 is formed in a bottom wall of a portion of the square pipe 180 which is covered with the cover 200. Fixed to a bottom face of the recess 220 in a cantilever fashion is a positioning member 222 which constitutes a positioning device for positioning the taped component 152 in its thickness direction and its longitudinal direction. The positioning member 222 is formed by a leaf spring, and one end portion of the positioning member 222 is fixed to the bottom face of the recess 220 while the other end portion of the positioning member 222 is elastically contactable with a lower face of the cover 200, thereby pressing the taped component 152 onto the lower face of the cover 200 to position the taped component 152 in the thickness direction. Further, a positioning protruding portion 224 having a spherical crown shape is formed on an upper face of the above-described contact portion. This positioning protruding portion 224 is engaged sequentially with the perforations 196 of the carrier tape 190 to position the taped component 152 in its longitudinal direction. In the positioning device, the positioning member 222 which is formed by the leaf spring and whose free end portion is elastically contactable with the lower face of the cover 200 serves as an urging portion.

When the taped component 152 is inserted into the passage 182 from a rear-end-side opening portion of the square pipe 180, a distal end of the taped component 152 is brought into contact with the positioning member 222 and stopped. However, when a greater pushing force is applied to the taped component 152 in this state, the positioning member 222 is bent by a wedge effect generated between a lower face of the upper wall of the square pipe 180 and an upper face of the positioning member 222 which has an acute angle to its lower face. This widens a clearance between the positioning member 222 and the lower face of the upper wall of the square pipe 180, allowing the taped component 152 to enter into the clearance. Then, one of the perforations 196 of the carrier tape 190 is engaged with the positioning protruding portion 224, which increases resistance to the movement of the taped component 152. However, since the positioning protruding portion 224 has the spherical crown shape, when the pushing force applied to the taped component 152 is increased, the positioning protruding portion 224 is disengaged from the perforation 196, allowing further movement of the taped component 152. When the next perforation 196 reaches the position of the positioning protruding portion 224, the resistance to the movement of the taped component 152 is increased again. Repetition of these operations sequentially and crisply positions the taped component 152 at the plurality of positions.

Therefore, when the taped-component feeding device 142 is moved to the engaged position as described above in a state in which the sprocket 136 as the feeding member is stopped by the control of the electric motor 138 at a rotation position at which the protruding portion 202 is engaged with the perforation 196 of the taped component 152 positioned as described above, the sprocket 136 is engaged with the taped component 152, making it possible to establish a state in which the taped component 152 can be fed. A rotation position detector 228 shown in FIGS. 7 and 8 is for detecting that the sprocket 136 is located at the rotation position at which the sprocket 136 is engageable with the taped component 152. In the illustrated example, the rotation position detector 228 is provided by a photoelectric switch of a transmission type and mounted on each of the pivot arms 146, 166.

In order to allow the sprocket 136 to be engaged with the taped component 152 as described above, as shown in FIG. 9, a cutout 226 serving as an entering allowing portion allowing the entrance of the sprocket 136 is formed in a portion of a bottom wall of the square pipe 180. In the illustrated example, the cutout 226 is formed in the portion of the bottom wall between the front edge 206 of the cover 200 and a position at which the positioning member 222 is engaged with the taped component 152.

As described above, the taped-component guide portions 114 of the first portions 102, 104 are mounted on the respective second portions 106, 108 in the state in which each taped-component guide portion 114 is inclined so as to be higher at its front portion than at its rear portion. This mounting is performed in the following manner.

Figure 11A:
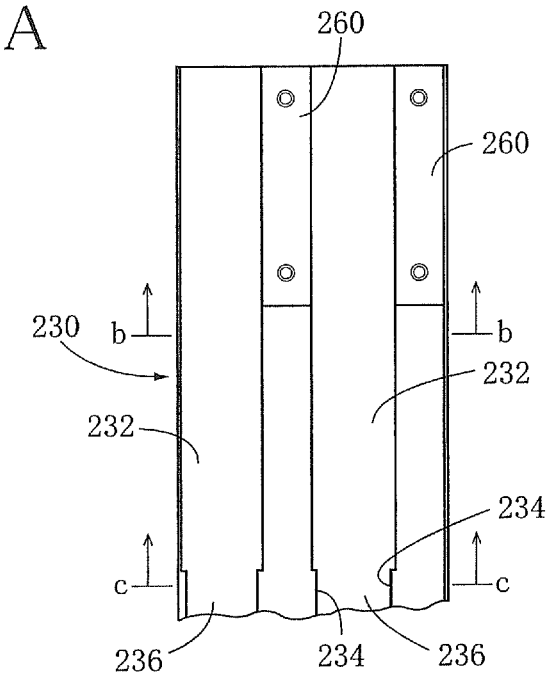
Figure 11B:
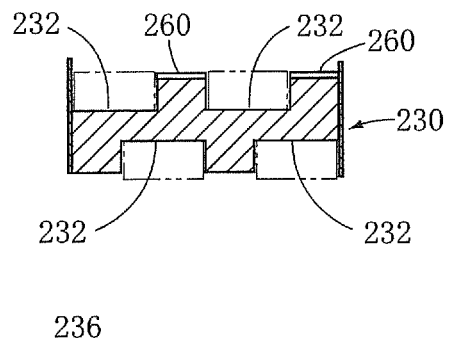
Figure 11C:
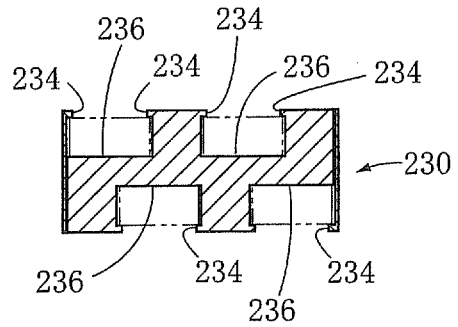

As shown in FIG. 11A, a guide-portion holding portion 230 is provided on the main-body member 120. As shown in FIG. 11B, in cross section along line b-b, this guide-portion holding portion 230 has receiving grooves 232 each having a rectangular shape in its cross section and having a depth slightly less than the height of the square pipe 180. As shown in FIG. 11C, in cross section along line c-c, this guide-portion holding portion 230 has holding grooves 236 each formed by deepening the receiving groove 232 so as to have a depth slightly greater than the height of the square pipe 180. Flanges 234 extending toward an inside of each of the holding grooves 236 are formed on an upper end of the holding groove 236. In a state in which the taped-component guide portion 114 is fitted in the holding groove 236, the holding groove 236 holds the taped-component guide portion 114 by surrounding four outer faces of the square pipe 180 such that the taped-component guide portion 114 is movable only in its longitudinal direction. In contrast, the receiving groove 232 merely receives the taped-component guide portion 114 from an upper side or a lower side thereof.

It is noted that a width of an elongated base member 240 (see FIG. 6) of the cover-tape peeling device 116 and the cover tape container 118 constituted as the integral component is slightly narrower than a distance between the flanges 234 provided on opposite sides of the holding groove 236. Further, a shape and dimensions of the cover 200 fixed to the square pipe 180 are designed such that the cover 200 does not project outward from the outer faces of the square pipe 180.

A width of each of the receiving groove 232 and the holding groove 236 and a depth of the holding groove 236 are each longer than each of a width and a height of the square pipe 180 such that, as shown in FIG. 6B, the cover tape 192 that is moved along the side faces of the square pipe 180 is allowed to pass through each of the receiving groove 232 and the holding groove 236.

Therefore, in a state in which the taped components 152 are set in the respective first portions 102, 104, the taped-component guide portions 114 of the respective first portions 102, 104 are inserted respectively into the holding grooves 236 and the receiving grooves 232 such that a distal end of each taped-component guide portion 114 is inserted first, whereby the guide-portion holding portion 230 holds the taped-component guide portions 114.

Each of the first portions 102, 104 is generally positioned in a direction perpendicular to its longitudinal direction in the above-described manner, but its positioning accuracy is not enough, and each of the first portions 102, 104 is movable in its longitudinal direction. Thus, positioning devices 246 shown in FIG. 7 are provided for accurately positioning the respective component supply portions 110. Each of the positioning devices 246 includes: a positioning pin 250 fixed to a bracket 248 fixed to a corresponding one of the pivot arms 146, 166; and a positioning hole 252 formed in the bottom wall of the square pipe 180 (noted that the positioning pin 250 and the positioning hole 252 corresponding to the pivot arm 146 are only illustrated). When each of the pivot arms 146, 166 is pivoted to the engaged position, the positioning pin 250 is fitted into the positioning hole 252, whereby the positioning device 246 accurately positions a portion of the corresponding one of the first portions 102, 104, which portion is located near the component supply portion 110.

As is clear from the foregoing explanation, each of the first portions 102, 104 constitutes a removable mounting unit, and each of the second portions 106, 108 constitutes a mounting/removing object. Further, the eight second portions sharing the main-body member 120 constitute an integrated second portion, and the eight removable mounting units (the first portions 102, 104) constitute a removable-mounting-unit group.

In the present embodiment, a distal end portion of the positioning pin 250 has a tapered outer circumferential face which is fitted into a tapered inner circumferential face of the positioning hole 252, so that the positioning pin 250 accurately positions the component supply portion 110 in the longitudinal direction and a widthwise direction of the taped-component guide portion 114. Further, the positioning pin 250 supports the taped-component guide portion 114 from a lower side thereof in a state in which the taped-component guide portion 114 is slightly and elastically deformed upward, whereby the positioning pin 250 also positions the component supply portion 110 in the height direction. However, a contact face may be formed on the guide-portion holding portion 230 or a peeled-carrier-tape guide member 258 which will be explained next, and the positioning of the component supply portion 110 in the height direction may be performed by bringing a distal-end vicinity portion of the taped-component guide portion 114 into contact with this contact face from a lower side thereof.

Figure 12:
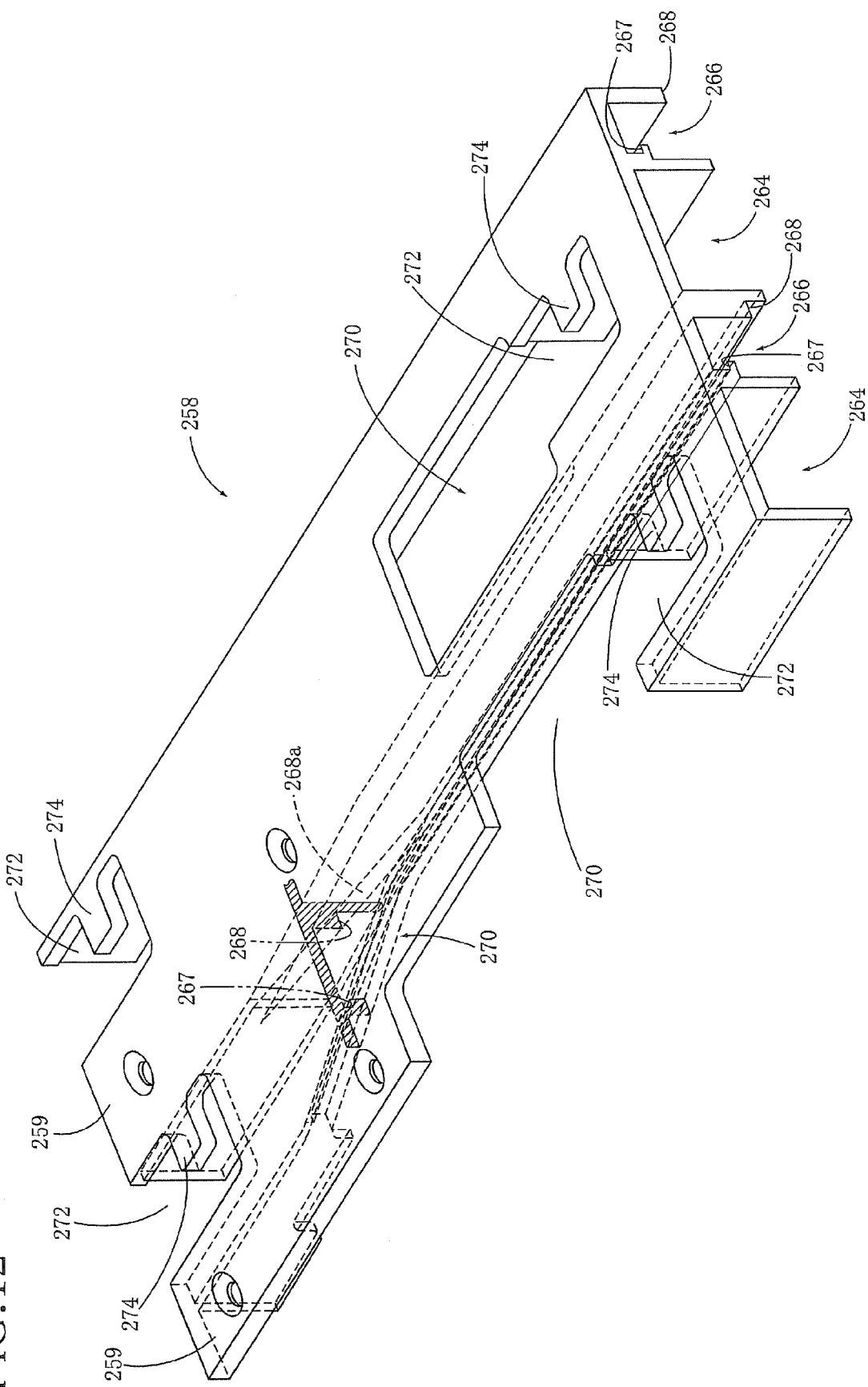
FIG. 12 is a perspective view showing a peeled-carrier-tape guide member of the tape feeder group.

The peeled-carrier-tape guide member 258 is shown in FIG. 12. This peeled-carrier-tape guide member 258 is mounted at its mount portions 259 (two mount portions in the illustrated example) on mount portions 260 of the guide-portion holding portion 230. The peeled-carrier-tape guide member 258 guides peeled carrier tapes 262 (see FIG. 10) to be discharged from the first portions 102, 104. Each peeled carrier tape 262 is a carrier tape from which the components 198 have already been picked up. For guiding the peeled carrier tapes 262, the peeled-carrier-tape guide member 258 includes first guide portions 264 and second guide portions 266 each having a generally groove shape. Each of the first guide portion 264 has a width slightly greater than that of the peeled carrier tape 262 for guiding the peeled carrier tape 262 on the first portion 102 disposed at a rear of the component supply portion 110, in a state in which the peeled carrier tape 262 is in its horizontal posture. Meanwhile, the peeled carrier tape 262 to be discharged from the first portion 104 disposed at a front of the component supply portion 110 needs to be discharged by passing through a clearance between distal end portions of the first portions 102 and a clearance between the first guide portions 264, which clearances are located ahead of the peeled carrier tape 262 to be discharged. However, each of the clearances has a width less than that of the peeled carrier tape 262. Thus, as shown in FIG. 10, the peeled carrier tape 262 needs to be twisted about a center line extending in its longitudinal direction to take a posture in which the peeled carrier tape 262 is inclined in its widthwise direction.

Accordingly, each of the second guide portions 266 includes: a first guide face 267 contactable with one side edge portion of the peeled carrier tape 262 from a lower side thereof; and a second guide face 268 contactable with the other side edge portion of the peeled carrier tape 262 from an upper side thereof. An intermediate portion of this second guide portion 266 in its longitudinal direction is an inclined portion 268a whose width is gradually decreased from a width slightly greater than that of the peeled carrier tape 262 to a width less than that of the peeled carrier tape 262. Further, the inclined portion 268a is inclined such that a front portion of the second guide face 268 is lower in height than a rear portion thereof. Meanwhile, the first guide face 267 is made generally horizontal. Therefore, as the peeled carrier tape 262 advances, the other side edge portion is pressed down with respect to the one side edge portion, so that the peeled carrier tape 262 is twisted about the center line extending in its longitudinal direction. It is noted that it has been explained that the first guide face 267 is made generally horizontal, but in reality, in order to allow the side edge portion near the first guide face 267 to be inclined as the peeled carrier tape 262 is twisted, the first guide face 267 is slightly inclined such that a clearance between the first guide face 267 and a bottom face of the groove of the second guide portion is larger at a front portion of the first guide face 267 than at a rear portion thereof. In the present embodiment, the above-described portion of the second guide portion 266 whose width is gradually decreased from the width slightly greater than that of the peeled carrier tape 262 to the width less than that of the peeled carrier tape 262 constitutes a peeled-carrier-tape twisting device 270.

The peeled-carrier-tape guide member 258 is disposed at a position at which a front end face of the first portion 104 is contactable with a rear end face of the peeled-carrier-tape guide member 258. The peeled-carrier-tape guide member 258 is located on an upper side of the first portion 102, but an opening 270 is formed at a position corresponding to a distal end portion of the first portion 102, allowing the distal end portion to be exposed upward. The peeled-carrier-tape guide member 258 has cutouts 272 extending frontward respectively from the rear end face and from a front end of the opening 270. A tongue piece 274 is formed so as to extend from a side edge of each of the cutouts 272 in a cantilever fashion, thereby preventing the peeled carrier tape 262 from floating upward. Each component 198 is taken out upward from a space between the component supply portion 110 and the tongue piece 274. Thus, it is possible to consider that the front end portion of the taped-component guide portion 114 and the tongue piece 274 cooperate to form the component supply portion.

In the mounting system constructed as described above, in each of the mounting modules 10, the component mounting machine 26 picks up the components 198 from the component supply portions 110 of the component supplying device 24 which are arranged in two rows, and then the component mounting machine 26 conveys the components to mount them onto the circuit substrate held by the substrate holding device 22. Thus, the plurality of feeders 58 capable of supplying a plurality of types of the components 198 to be mounted on the circuit substrate need to be mounted on the component supplying device 24.

In the component supplying device 24 as the present embodiment, as described above, it is possible to replace the eight feeders 58 all together by mounting and removing the main-body member 120 holding the eight feeders 58 on and from the feeder holding table 52, and it is also possible to individually replace the first portions 102, 104 of each feeder 58 by mounting and removing each of the first portions 102, 104 on and from the corresponding one of the second portions 106, 108. In both cases, the taped component 152 can be mounted in advance in a state in which the main-body member 120 is removed from the feeder holding table 52 together with the feeders 58 or in a state in which each of the first portions 102, 104 is removed from the corresponding one of the second portions 106, 108. That is, the taped component 152 is inserted into the taped-component guide portion 114 of the first portion 102 of each of the feeders 58, 104, whereby one of the perforations 196 can be set to be engaged with the positioning protruding portion 224 of the positioning member 222, and the distal end portion of the cover tape 192 peeled from the carrier tape 190 of the taped component 152 can be set to be inserted into the cover tape container 118 via the cover-tape feeding device 214.

When each of the thus set first portions 102, 104 is mounted on the corresponding one of the second portions 106, 108, the taped-component guide portion 114 is inserted into the holding groove 236 of the guide-portion holding portion 230 in a state in which the distal end of the taped-component guide portion 114 is inserted first, and the taped-component guide portion 114 is pushed until a front end face of the taped-component guide portion 114 is brought into contact with the peeled-carrier-tape guide member. It is noted that, also in this state, the front edge 206 is slightly retracted from a front end face of the square pipe 180 such that a clearance allowing movement of the cover tape 192 peeled from the carrier tape and engaged with the front edge 206 of the cover 200 is formed between the peeled-carrier-tape guide member and the front edge 206.

As described above, when each of the operating levers 148, 168 shown in FIG. 5 is operated to pivot the corresponding one of the pivot arms 146, 166 to the engaged position in the state in which the front end face of the taped-component guide portion 114 is held in contact with the peeled-carrier-tape guide member, the positioning pin 250 of the positioning device 246 is fitted into the positioning hole 252, thereby positioning the component supply portion 110 in the longitudinal direction of the taped-component guide portion 114 and in any direction perpendicular to the longitudinal direction. In this operation, one of the protruding portions 202 of each of the sprockets 136, 156 is fitted into one of the perforations 196 of the taped component 152. Thus, when the sprockets 136, 156 are rotated at each constant angle, the taped component 152 is fed for a distance equal to a pitch of the component-accommodating recesses 194 by each rotation. In parallel, also in the cover-tape feeding device 214, each of the feed gears 208, 210 is rotated at each constant angle. Thus, the cover tape 192 is peeled from the carrier tape 190, whereby the component-accommodating recess 194 is exposed and positioned at a component supply position.

In the present embodiment, the feeders 58 are divided into two groups, namely, a group constituted by the first portion 102 and the second portion 106 and a group constituted by the first portion 104 and the second portion 108. In each of two tape feeder groups, the component supply portions 110 are arranged in an arrangement direction parallel to two lines at pitches each less in length than twice a width of each of the component supply portions 110 (it should be noted that each of the pitches is greater in length than the width of each of the component supply portions 110). Further, when a side of the feeder 58 where the component supply portion 110 is located is called a front side, and a side of the feeder 58 where the reel holding portion 112 is located is called a rear side, the peeled carrier tape 262 from which the components 198 have been taken out by the component supply portion 110 belonging to a rear row is discharged frontward through a space having a width less than that of the component supply portion 110 and formed between adjacent two of the component supply portions 110 belonging to a front row.

Figure 14:
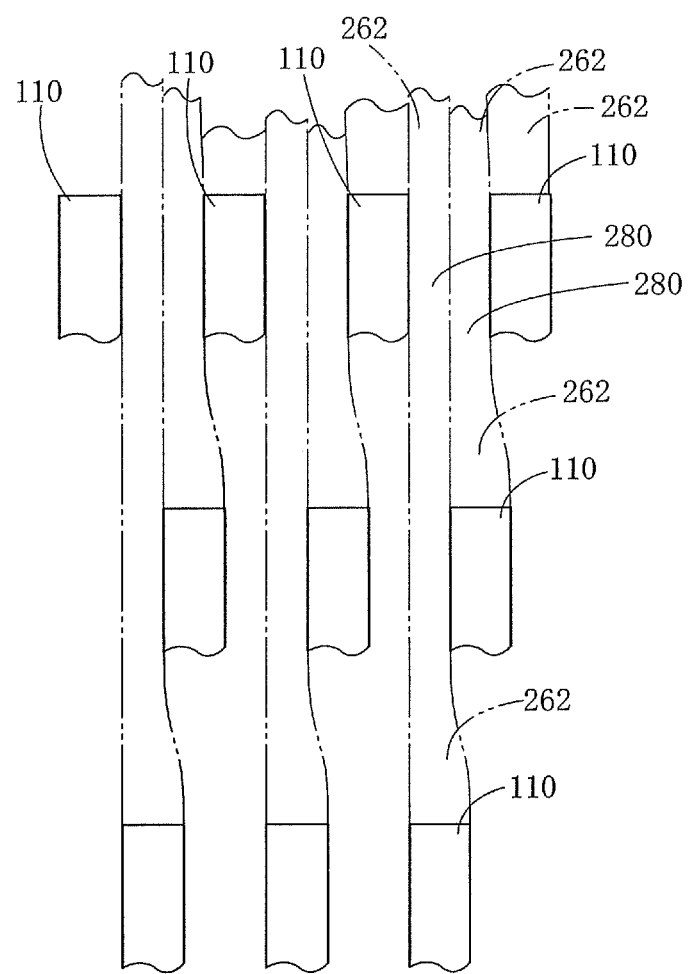
FIG. 14 is a plan view schematically showing component supply portions and discharge passages each for discharging the peeled carrier tape in a component supplying device as another embodiment.

However, the rows of the component supply portions 110 are not limited to the two rows and can be generalized to N rows. In this case, the component supplying devices are configured in a state in which the above-described "two" is changed to "N". Where N is three as shown in FIG. 14, each of the peeled carrier tapes 262 from which the components 198 have been taken out in the component supply portion 110 belonging to the rear row is discharged frontward through a corresponding one of guide portions 280 whose width is less than that of the component supply portion 110 and which is located between corresponding adjacent two of the component supply portions 110 which belong to the forefront row.

Further, in the present embodiment, the taped-component feeding devices 142, 162 are held by the pivot arms 146, 166, respectively, and when the pivot arms 146, 166 are pivoted by the respective cams 150, 170, the taped-component feeding devices 142, 162 are moved to their respective engaged positions. However, the taped-component feeding devices 142, 162 may be configured so as to be urged to their respective engaged positions by urging forces of respective urging devices and so as to be moved to their respective disengaged positions by operations of respective operating members such as the operating levers 148, 168. For example, the pivot arms 146, 166 holding the respective taped-component feeding devices 142, 162 are urged to the engaged positions of the respective taped-component feeding devices 142, 162 by the urging devices each at least including an elastic member such as a compression coil spring disposed between each of the pivot arms 146, 166 and the main-body member 120, and the pivot arms 146, 166 are moved to their respective disengaged positions against urging forces of the urging devices by cams rotated by the operation of the respective operating levers 148, 168.

As shown in FIGS. 5, 7, and 8, each of the second portions 106 which constitutes the one feeder 58 with the first portion 102 includes the taped-component feeding device 142 including: the sprocket 136 as the feeding member; the electric motor 138 having the speed reducer as the drive source; and the rotation transmitting mechanism 140. This taped-component feeding device 142 is held by the pivot arm 146 that is pivotably supported by the main-body member 120 via the support shaft 144. The cam 150 (the eccentric cam in the illustrated example) rotated by an operation of the operating lever 148 moves the taped-component feeding device 142 between the engaged position at which the sprocket 136 is engaged with the taped component 152 and the disengaged position at which the sprocket 136 is disengaged and distant from the taped component 152. Though the illustration and explanation for the interlock device for interlocking between the operating lever 148 and the cam 150 are omitted, the interlock device is configured such that the pivot arm 146 is pivoted to the engaged position when the operating lever 148 is pushed down, whereby the engaging/disengaging device 154 is constituted by the operating lever 148, the interlock device, the cam 150, and the pivot arm 146.

It is noted that, as most clearly shown in FIGS. 7 and 8, in the taped-component feeding devices 142 of the two first portions 102 next to each other, the positions of the two electric motors 138 are displaced from each other in the front and rear direction. Thus, the arrangements of the components of the two rotation transmitting mechanisms 140 are different from each other, but the components themselves are the same between the two rotation transmitting mechanisms 140.

Figure 15:
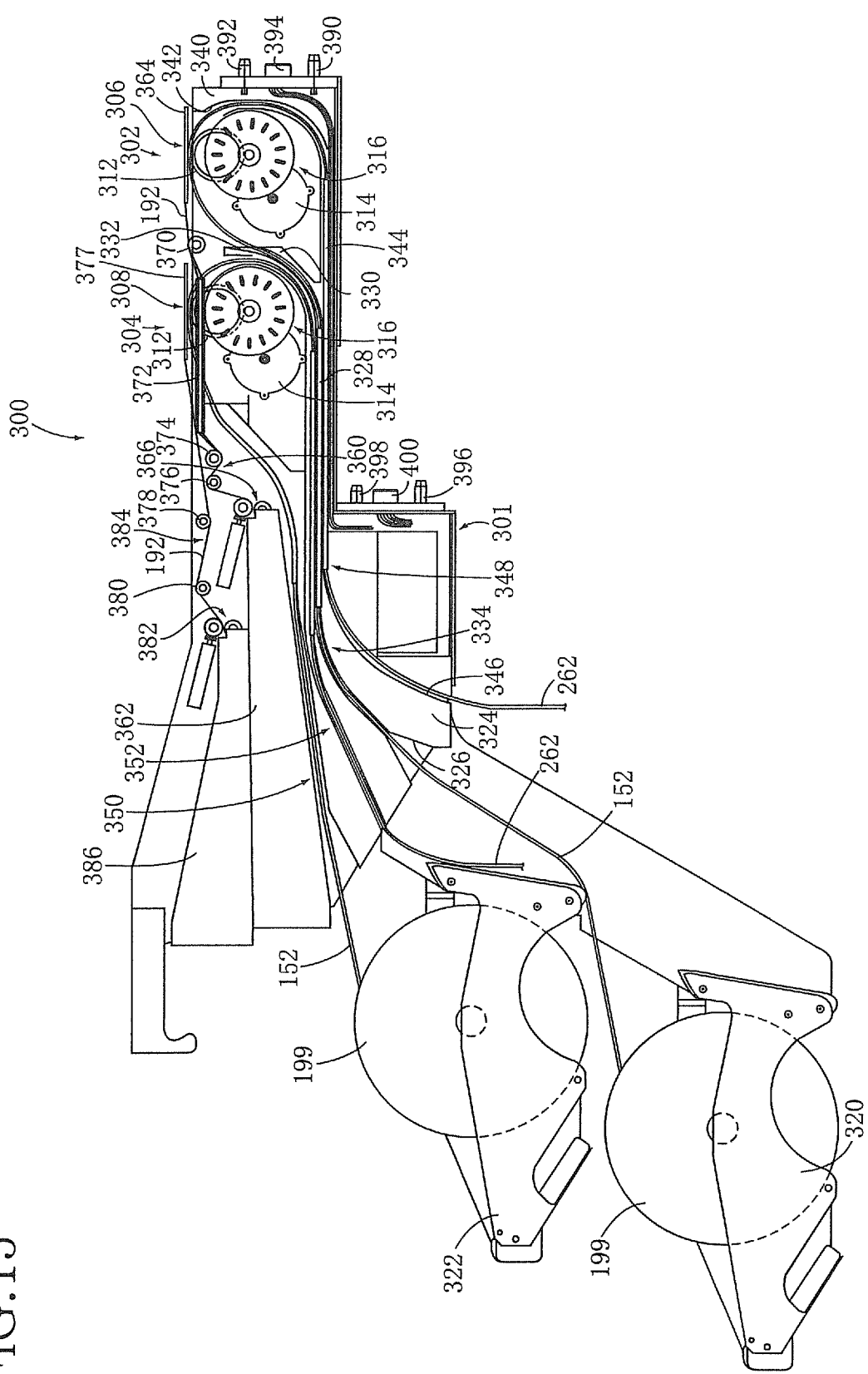
FIG. 15 is a side view showing a tape feeder as one component of a component supplying device as another embodiment.

Another embodiment is shown in FIG. 15. The present embodiment is one embodiment of the form in which the component supply portions of the feeders are arranged along respective straight lines perpendicular to each other in one plane.

In the present embodiment, a plurality of feeders 300 are arranged in a state in which a longitudinal direction of each elongated feeder body 301 is horizontal. In each of the feeders 300, when a downstream side and an upstream side in the direction in which the taped component 152 is fed are called a front side and a rear side, respectively, a first taped-component feeding device 302 and a second taped-component feeding device 304 are arranged in the front and rear direction, and thus a first component supply portion 306 and a second component supply portion 308 are formed so as to be arranged in a direction parallel to the direction in which the taped component 152 is fed. Further, at least three feeders 300 are mounted on a feeder holding table, not shown, similar to the feeder holding table 52, in a row in the above-described embodiment in a direction perpendicular to the direction in which the taped component 152 is fed. Thus, the plurality of the component supply portions (306, 308) are arranged along two first lines and at least three second lines in one plane (the horizontal plane in the present embodiment). The first lines and the second lines are perpendicular to each other in one plane.

Each of the first and second taped-component feeding devices 302, 304 includes a sprocket 312 as the feeding member, an electric motor 314, and a rotation transmitting mechanism 316. A plurality of gears constituting the sprocket 312 and the rotation transmitting mechanism 316 are illustrated each as a simple circle for simplification of the drawing, but each gear has protruding portions or teeth on its outer circumferential face.

Each of the feeders 300 includes a first reel holding portion 320 and a second reel holding portion 322 located on an upper side thereof. The taped component 152 drawn from the reel 199 held by the first reel holding portion 320 rotatably passes through a lower side of the second taped-component feeding device 304 and is wound on the sprocket 312 of the first taped-component feeding device 302. The peeled carrier tape 262 from which the components 198 have been taken out also passes through a lower side of the second taped-component feeding device 304 and is discharged to an outside of the feeder 300 at a position near the first reel holding portion 320. Specifically, the taped component 152 is guided by a first taped-component guide device 334 as a first guide portion including: a guide groove 326 formed in a guide member 324; a guide pipe 328; and a guide groove 332 formed in a guide member 330. The peeled carrier tape 262 is guided by a first peeled-carrier-tape guide device 348 as a second guide portion including: a guide groove 342 formed in a guide member 340; a guide pipe 344; a guide groove 346 formed in the guide member 324. Each of the taped component 152 and the peeled carrier tape 262 is moved in its longitudinal direction.

The taped component 152 drawn from the reel 199 of the second reel holding portion 322 and the peeled carrier tape 262 from which the components have been taken out are also guided by a second taped-component guide device 350 and a second peeled-carrier-tape guide device 352 as in the above-described embodiment, but positions at which the second taped-component guide device 350 and the second peeled-carrier-tape guide device 352 are formed are different from those in the above-described embodiment. As clearly shown in the drawing, the second peeled-carrier-tape guide device 352 is provided on an upper side of the first taped-component guide device 334, and the second taped-component guide device 350 is provided on an upper side of the second peeled-carrier-tape guide device 352.

The cover tape 192 of the taped component 152 drawn from the reel 199 held by the first reel holding portion 320 and fed by the first taped-component feeding device 302 is peeled from the carrier tape 190 by a first cover-tape peeling device 360 and then accommodated into a first cover tape container 362. An openable and closable first cover 364 is provided on an upper side of the sprocket 312 of the first taped-component feeding device 302, and one edge of an opening formed in the first cover 364 (i.e., a rear edge of the opening in the direction in which the taped component 152 is fed) serves as the peel-back guide portion. The first cover-tape peeling device 360 is constituted by this peel-back guide portion and a cover-tape feeding device 366 including a pair of feed gears. It is noted that the cover tape 192 is drawn toward an upper side of the cover 364 in its horizontal posture in its widthwise direction, while the cover-tape feeding device 366 is provided on a lower side of the cover 364. Thus, the cover tape 192 is moved so as to pass through a guide roller 370, then twisted 90 degrees, then guided by a guide member 372 in its vertical posture, then twisted 90 degrees again between the guide member 372 and a guide roller 374 to be returned to its horizontal posture in which the cover tape 192 is horizontal in its widthwise direction, then moved so as to pass through a guide roller 376, and finally nipped by the pair of feed gears of the cover-tape feeding device 366.

It is noted that the guide member 372 is held by a side plate fixed to the feeder body 301, but the side plate is not illustrated for easier understanding of an internal construction. Thus, the guide member 372 is illustrated in a state in which the guide member 372 floats in the air.

The cover tape 192 of the taped component 152 drawn from the reel 199 held by the second reel holding portion 322 and fed by the second taped-component feeding device 304 is drawn toward an upper side of a second cover 377 in its horizontal posture in its widthwise direction, then wound onto guide rollers 378, 380 in the horizontal posture, and then nipped by a pair of feed gears of a second cover-tape feeding device 382. A peel-back guide portion of the second cover 377 and the second cover-tape feeding device 382 constitute a second cover-tape peeling device 384. The cover tape 192 fed by the second cover-tape feeding device 382 is accommodated into a second cover tape container 386.

As is clear from the explanation above, in the present embodiment, the opening formed in the first cover 364 serves as the first component supply portion 306, and an opening formed in the second cover 377 serves as the second component supply portion 308.

Positioning pins 390, 392 and a connector 394 are provided on a front portion of the feeder body 301, while positioning pins 396, 398 and a connector 400 are provided on a rear portion of the feeder body 301. The connector 394 is for supplying a current and control signals to the first taped-component feeding device 302 and the first cover-tape feeding device 366, and the connector 400 is for supplying a current and control signals to the second taped-component feeding device 304 and the second cover-tape feeding device 382. However, this apparatus may be configured such that the connector 394 is for supplying a current and control signals to the first and second taped-component feeding devices 302, 304, and the connector 400 is for supplying a current and control signals to the first and second cover-tape feeding devices 366, 382.

In the present embodiment, the cover tape 192 peeled from the taped component 152 fed by the first taped-component feeding device 302 is twisted 90 degrees and moved in its vertical posture from an upper side toward a lower side of the taped component 152 fed by the second taped-component feeding device 304, and the first cover-tape peeling device 360 and the first cover tape container 362 are respectively provided below the second cover-tape peeling device 384 and the second cover tape container 386. This construction has an advantage in which interference between the two cover tapes 192 can be easily avoided.

However, a first cover-tape feeding device 366 can be provided on an upper side of the second cover-tape feeding device 382 by changing an arrangement of the guide roller. In this case, the first cover tape container 362 may be provided on an upper side of the second cover tape container 386, and the first cover tape container 362 may be provided at a rear of the second cover tape container 386. In the former case, the cover tape 192 fed by the first cover-tape feeding device 366 passes through an upper side of the second cover-tape peeling device 384. In the latter case, the cover tape 192 fed by the first cover-tape feeding device 366 passes through an upper side of the second cover-tape peeling device 384 and the second cover tape container 386.

Another embodiment is shown in FIGS. 16-19. Like the above-described embodiment, the present embodiment is one embodiment of the form in which the component supply portions of the feeders are arranged along respective straight lines perpendicular to each other in one plane, but different from the above-described embodiment in means for realizing the embodiment.

Figure 16:
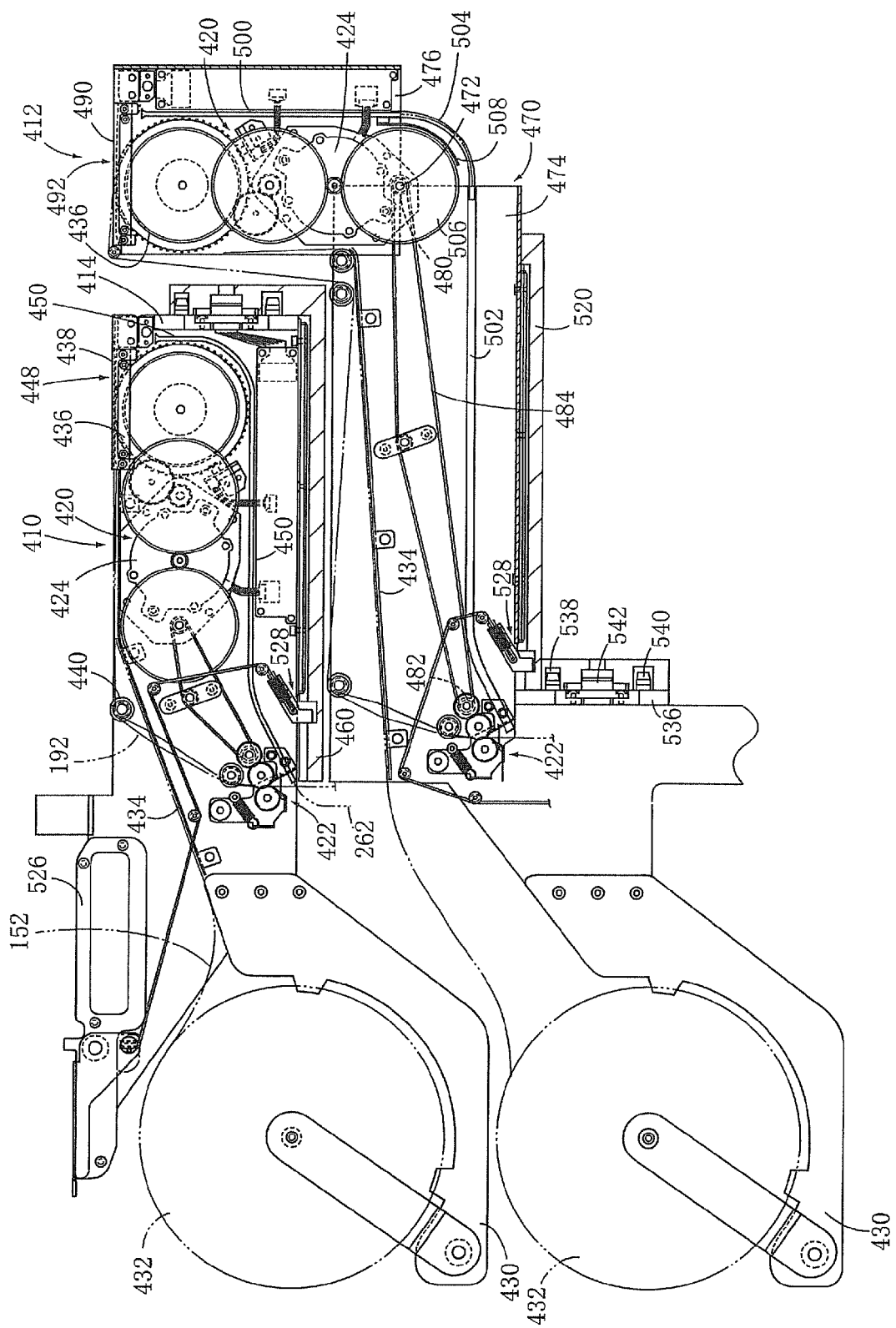
FIG. 16 is a side view showing a state of a component supplying device as another embodiment upon supplying components.
Figure 17:
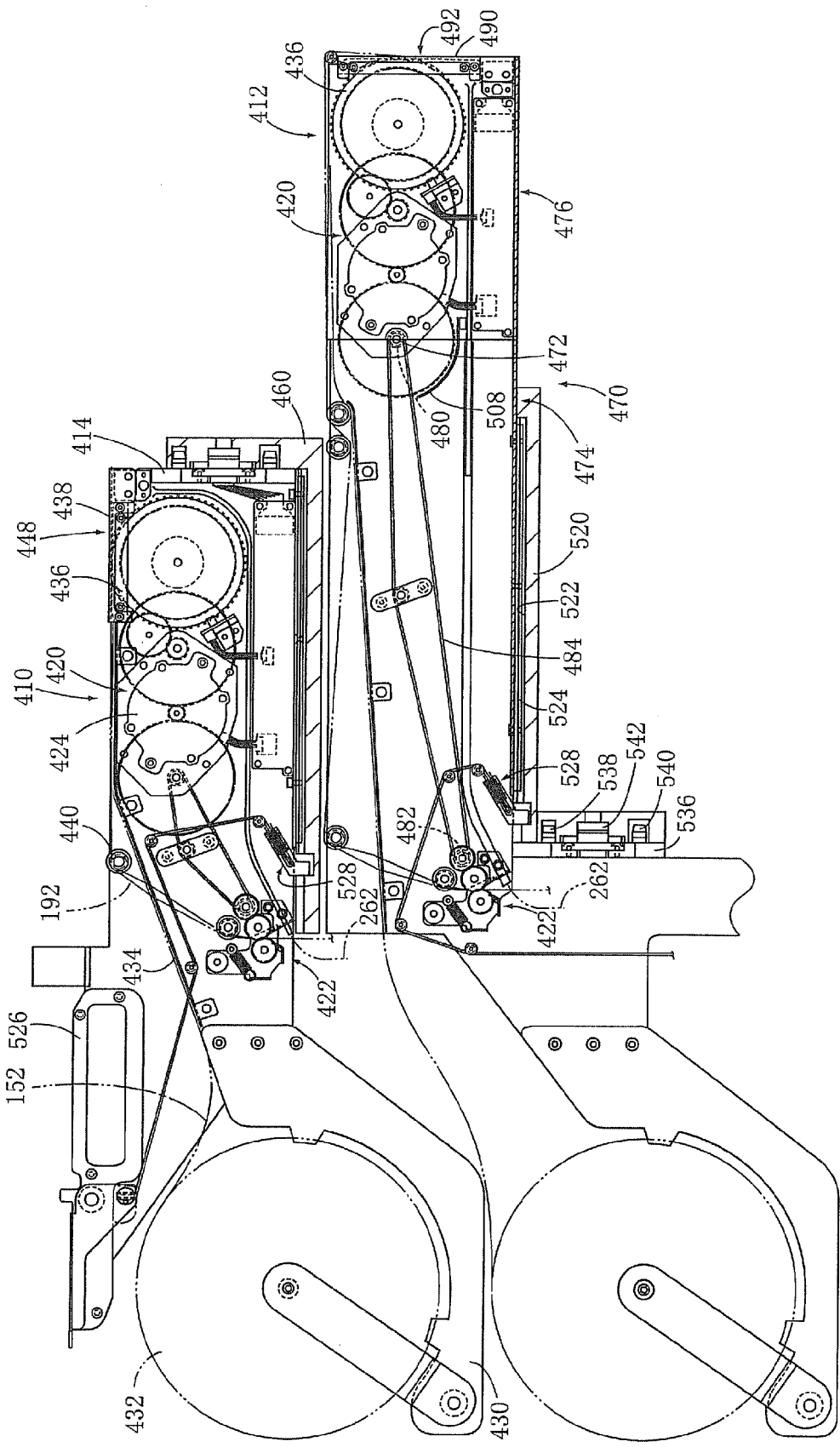
FIG. 17 is a side view showing a state of the component supplying device shown in FIG. 16 upon mounting or removal of the component supplying device.
Figure 18:
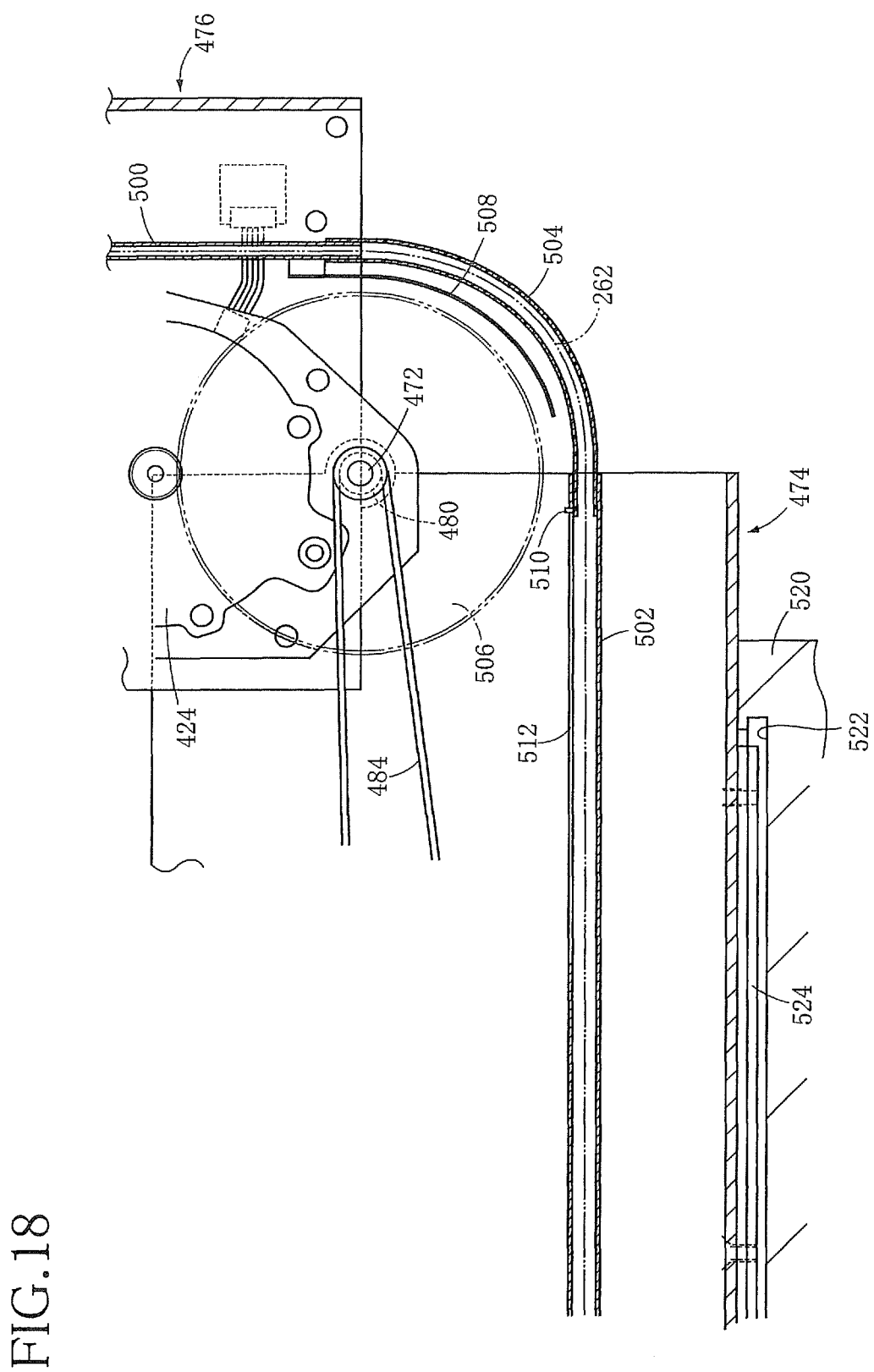
FIG. 18 is an enlarged view showing a part of the component supplying device shown in FIG. 16.

That is, a plurality of feeders 410, 412 (two feeders in the illustrated example) are arranged so as to overlap each other in an up and down direction, and each of the feeders 412 disposed on a lower side is configured so as to take a state shown in FIG. 16 in which a front portion thereof is bent and a state shown in FIG. 17 in which the front portion extends straight from a rear portion thereof.

An internal construction of this embodiment is generally the same as that of a known feeder and thus will be simply explained, and only a difference will be explained in detail.

Each of the feeders 410 disposed on an upper side includes: a feeder body 414; and a taped-component feeding device 420 and a cover-tape feeding device 422 held by the feeder body 414. These taped-component feeding device 420 and cover-tape feeding device 422 share an electric motor 424 serving as a drive source. The taped component 152 drawn from a reel 432 rotatably held by a reel holding portion 430 fixed to a rear end portion of the feeder body 414 passes through a taped-component guide portion constituted by a guide plate 434 and is then fed by a sprocket 436 of the taped-component feeding device 420. The cover tape 192 peeled from the taped component 152 while guided by a peel-back guide portion of a cover 438 passes through a cover-tape guide portion including a guide roller 440 and is then fed by the cover-tape feeding device 422 provided on a rear portion of the feeder body 414 so as to be discharged to an outside of the feeder 410. The peeled carrier tape 262 from which the cover tape 192 has been peeled off and from which the components 198 are taken out at a component supply portion 448 constituted by an opening of the cover 438 is guided by a peeled-carrier-tape guide portion constituted by a guide pipe 450 and then discharged from the rear end portion of the feeder body 414 to the outside of the feeder 410.

The feeder 410 is removably mounted on an upper face of a feeder holding table 460 as a feeder holding member. A means for mounting the feeder 410 onto the feeder holding table 460 is the same as that for the feeder 412 disposed on a lower side thereof, and thus will be explained with the feeder 412 as an example.

An internal construction of the feeder 412 disposed on a lower side is the same as that of the feeder 410. Thus, the same reference numerals are used to designate the corresponding elements, and an explanation of which is dispensed with. Hereinafter, only a difference will be explained.

A feeder body 470 of the feeder 412 includes a fixed portion 474 as a main portion and a pivot portion 476 connected to each other by a connection shaft 472 so as to be pivotable relative to each other. The pivot portion 476 can selectively take one of a bent posture shown in FIG. 16 in which the pivot portion 476 stands upright so as to be bent with respect to the fixed portion 474 and an extending posture in FIG. 17 in which the pivot portion 476 lies horizontally so as to extend straight from the fixed portion 474. The pivot portion 476 can be secured to each other in each of the postures. As a device for the securing may be used a device capable of securing the pivot portion 476 to the fixed portion 474 such that, when the pivot portion 476 takes the bent posture, a ball of a ball plunger fixed to the pivot portion 476 is fitted into an engaging recess formed in the fixed portion 474 and such that, when the pivot portion 476 takes the extending posture, a lower portion of an end face of the pivot portion 476 contacts a lower portion of an end face of the fixed portion 474, for example. In this embodiment, a combination of the ball plunger and the engaging recess and a combination of the lower portions of the two end faces contactable with each other constitute a posture keeping device configured to selectively keep the pivot portion 476 to one of the two postures, namely, the bent posture and the extending posture.

The connection shaft 472 is also used as a rotation shaft of a timing pulley 480 (see FIG. 18) that is one component of a rotation transmitting mechanism of the cover-tape feeding device 422. Thus, even when the pivot portion 476 is pivoted with respect to the fixed portion 474, a distance between the connection shaft 472 and a rotation shaft of a timing pulley 482 is not changed, causing no effect on a timing belt 484.

Supply of the components is performed when the pivot portion 476 is in the bent posture. Thus, as shown in FIG. 16, a cover 490 is provided so as to cover an end face of the pivot portion 476. An opening formed in the cover 490 serves as a component supply portion 492, and a rear edge of the opening serves as a peel-back guide portion of the cover tape 192.

As described above, when the components are supplied in the state in which the pivot portion 476 is in the bent posture, the peeled carrier tape 262 needs to be fed from a guide pipe 500 of the pivot portion 476 being in the bent posture to a guide pipe 502 of the fixed portion 474. As enlargedly shown in FIG. 18, a guide for this feeding is performed by a flexible tube 504 formed of a soft synthetic resin having flexibility. The flexible tube 504 has: one end portion fitted on and secured to an outer face of the guide pipe 500; and the other end portion slidably fitted in the guide pipe 502. When the pivot portion 476 is in the extending posture shown in FIG. 19, the flexible tube 504 is accommodated in the guide pipe 502 in a state in which the flexible tube 504 extends straight, but when the pivot portion 476 is in the bent posture shown in FIG. 18, a most part of the pivot portion 476 comes out of the guide pipe 502 and curved in an arc shape.

Deformation of the flexible tube 504 in a direction toward a gear 506 rotatable with the connection shaft 472 is prevented by a contact preventive member 508 fixed to the guide pipe 500, while deformation of the flexible tube 504 in a direction away from the gear 506 is prevented by setting a limit of the flexible tube 504 coming out of the guide pipe 502. For example, this setting of the limit of the flexible tube 504 coming out of the guide pipe 502 can be performed in the following manner: a stopper 510 projected outward in its radial direction from an outer circumferential face of the one end portion of the flexible tube 504 is brought into contact with one end of a slot 512 formed in an outer wall of the guide pipe 502 along a longitudinal direction thereof.

Figure 19:
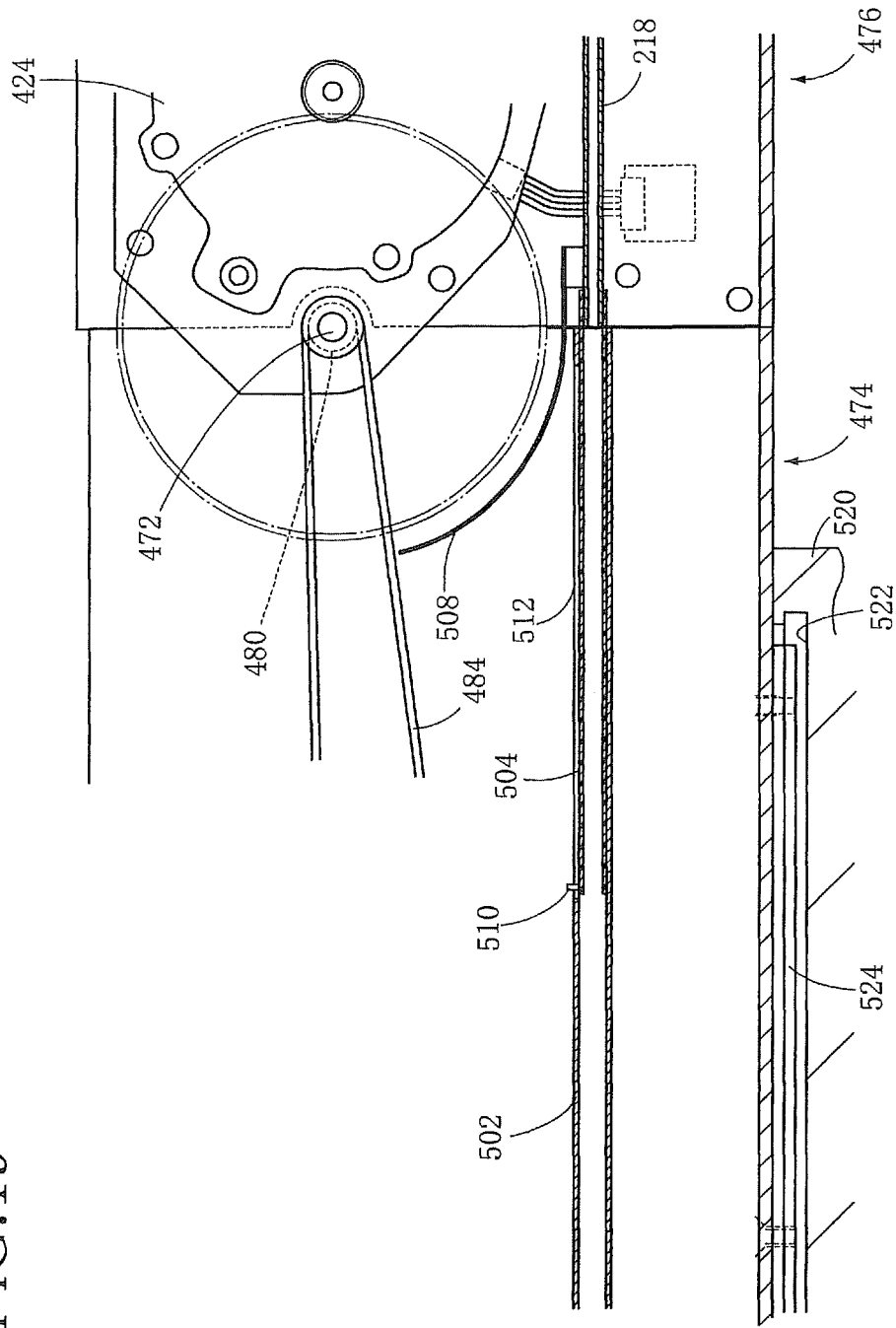
FIG. 19 is an enlarged view showing a part of the component supplying device shown in FIG. 17.

It is noted that, the stopper 510 can be fitted into the slot 512 by inserting the flexible tube 504 into the guide pipe 502 in a state in which the flexible tube 504 is elastically deformed in a direction in which the flexible tube 504 is compressed in its radial direction, and then returning the flexible tube 504 to its original shape. Further, as shown in FIG. 19, in the state in which the pivot portion 476 is in the extending posture, the contact preventive member 508 curved in the arc shape is pivoted along an outer circumferential face of the gear 506 to a position near the timing belt 484. Thus, a space for allowing this movement is formed in the fixed portion 474.

The feeder 412 constructed as described above is removably mounted on a feeder holding table 520. This mounting is performed in the following manner: the feeder 412 is first inserted from a side where the pivot portion 476 is located, into a space between the feeder holding table 460 and the feeder holding table 520 located on a lower side thereof in the state in which the pivot portion 476 is in the extending posture, and then a fitting protruding portion 524 provided on a lower face of the fixed portion 474 so as to have a T-shape in cross section is fitted into a T-shaped groove 522 formed in an upper face of the feeder holding table 520, and a lock device 528 operated by an operation of an operating lever (not shown, see an operating lever 526 of the feeder 410) is set to a lock state. With this mounting of the feeder 412, positioning pins 538, 540 of a connecting portion 536 extending downward from a rear end of the fixed portion 474 are fitted into positioning holes formed in the feeder holding table 520, and a connector 542 of the connecting portion 536 is connected to a connector of the feeder holding table 520.

The feeder 410 is mounted on the feeder holding table 460 in the same manner. In a state in which the feeders 410, 412 are mounted on the feeder holding tables 460, 520, respectively, the plurality of the feeders 410 are arranged in a row along a straight line perpendicular to the front and rear direction coinciding with the direction in which the taped component 152 is fed, and the plurality of the feeders 412 are arranged in a row in the same manner. The plurality of the component supply portions 448 of the feeders 410 and the plurality of the component supply portions 492 of the feeders 412 are arranged in two rows in one horizontal plane along two straight lines parallel to each other, and each of the component supply portions 448 and a corresponding one of the component supply portions 492 are arranged along a straight line extending in the front and rear direction.

It is noted that, in the present embodiment, the taped-component feeding device 420 and the cover-tape feeding device 422 shares the electric motor 424, but this configuration is not essential, and specific electric motors may be provided as in the above-described embodiment. Likewise, in the above-described embodiment, the taped-component feeding device (142, 162, 302, 304) and the cover-tape feeding device (214, 362, 382, 384) may be configured to share an electric motor.

In the above-described embodiment, the pivot portion 476 taking the bent posture is pivoted to the vertical posture, but this configuration is not essential. The pivot portion 476 may be configured to be pivoted to a posture in which the pivot portion 476 is inclined with respect to the vertical direction (for example, the pivot portion 476 is inclined frontward), and the components may be supplied in that posture.

Figure 20:
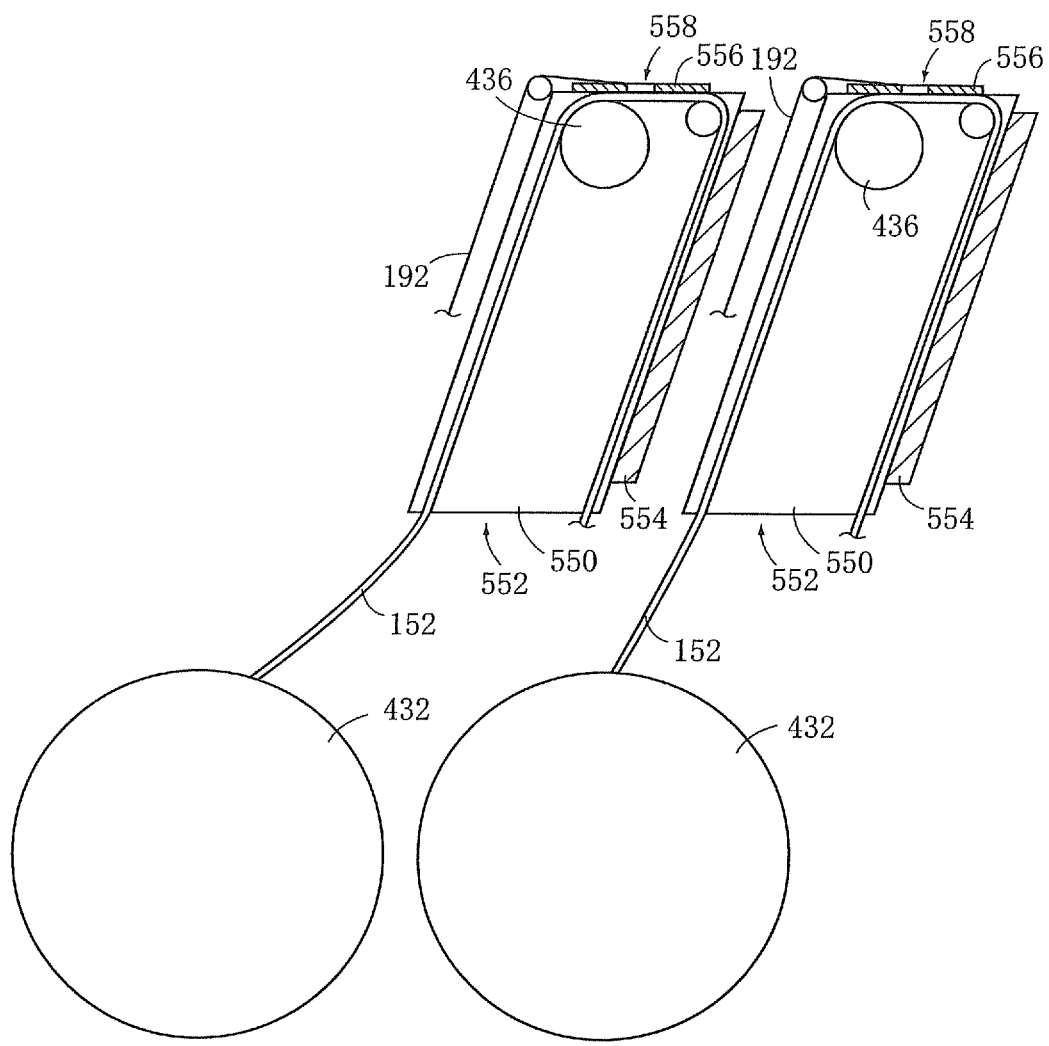
FIG. 20 is a view schematically showing a component supplying device as another embodiment.

Further, the feeder body may not include the main portion (the fixed portion) and the pivot portion. For example, as shown in FIG. 20, the apparatus may be configured such that an entirety of a feeder 552 including an integral feeder body 550 is held in its inclined posture by a feeder holding member 554, and the components are taken out from a component supply portion 558 constituted by an opening of a cover 556 provided on an upper end portion of the feeder 552.

The feeder holding member may not be provided for each group of the feeders arranged in a row, and one feeder holding member may be used for two groups of the feeders.

Figure 21:
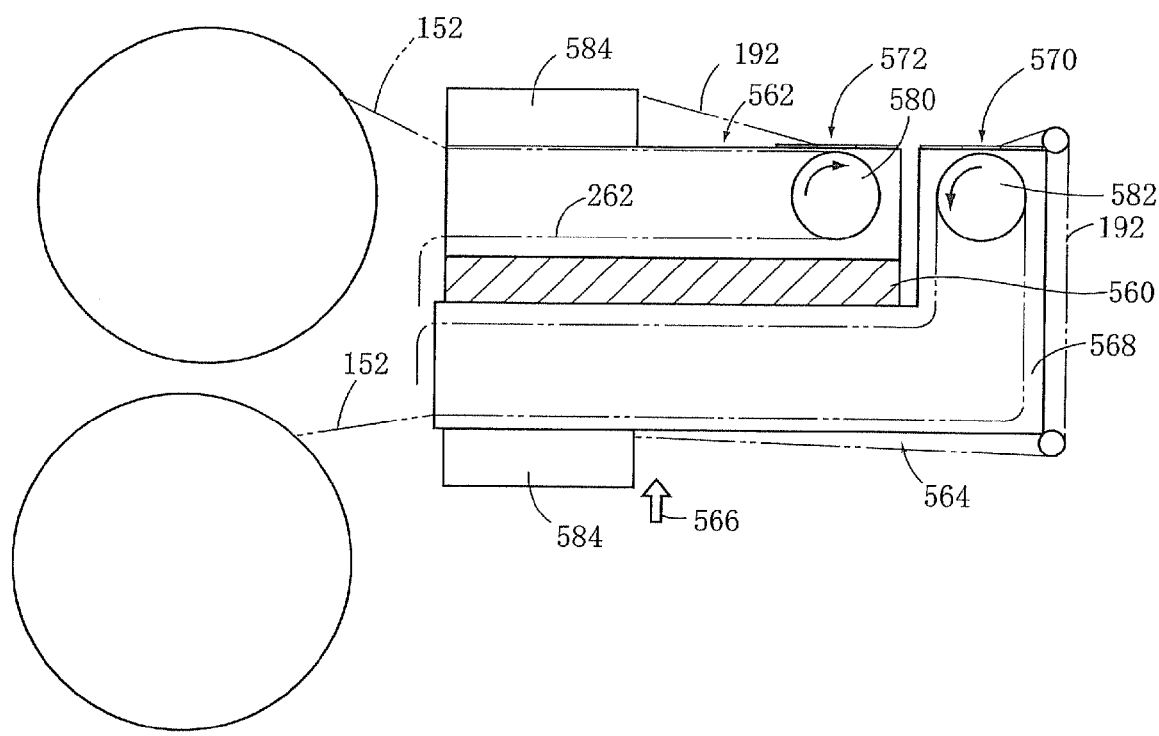
FIG. 21 is a view schematically showing a component supplying device as another embodiment.

For example, as shown in FIG. 21, a group of feeders 562 are mounted on an upper face of a feeder holding member 560, and another group of feeders 564 are mounted on a lower face of the feeder holding member 560. In this configuration, the feeders 564 may be mounted onto the lower face of the feeder holding member 560 from a lower side thereof as indicated by arrow 566. In this case, even if a feeder body 568 of each feeder 564 has an upward bent shape, the feeder body 568 can be mounted on the feeder holding member 560 without any problem, and a component supply portion 570 of the feeder 564 and a component supply portion 572 of another feeder 562 can be positioned in the same plane.

It is noted that, in the present embodiment, a sprocket 580 of the feeder 562 is rotated in a clockwise direction in FIG. 21, while a sprocket 582 of the feeder 564 is rotated in a counterclockwise direction, whereby the taped components 152 are respectively fed by the feeders 562, 564 in opposite directions. Reference numeral 584 denotes a cover tape container 584.

In the above-described embodiments, the cover tape 192 is peeled completely from the carrier tape 190, and thereby the component-accommodating recesses 194 are opened, but this configuration is not essential. For example, as described in JP-T-2002-533943, the feeder may include a half-peeling device configured to keep a state in which the cover tape for covering the plurality of component-accommodating recesses of the carrier tape of the taped component fed by the taped-component feeding device is fastened to the carrier tape at a fastening portion located on one side of the row of the component-accommodating recesses, and configured to establish a state in which a central portion of the cover tape which covers the row of the component-accommodating recesses and a side portion of the cover tape which is located on the other side from the fastening portion stand up so as to expose upper portions of the component-accommodating recesses.

In this construction, after the component-accommodating recesses are exposed and then the components are taken out, it is possible to return the cover tape to its original state in which the cover tape is fastened to the carrier tape. This makes it possible to dispose of the cover tape together with the peeled carrier tape, eliminating the need for providing a device specifically for disposing of the cover tape such as the cover-tape peeling device and the cover tape container. This facilitates the construction of the component supplying devices in which the component supply portions are arranged in rows in one plane.

EXPLANATION OF REFERENCE NUMERALS

10: mounting module, 24: component supplying device, 26: component mounting machine, 32: electric controlling device, 52: feeder holding table, 53: support plate, 54: connection wall, 55: T-shaped groove, 56: positioning hole, 57: connector, 58: feeder (tape feeder), 100: feeder assembly, 102, 104: first portion, 106, 108: second portion, 110: component supply portion, 112: reel holding portion, 114: taped-component guide portion, 116: cover-tape peeling device, 118: cover tape container, 120: main-body member, 122: protruding portion, 125, 126: positioning pin, 128: connector, 136: sprocket, 138: electric motor, 140: rotation transmitting mechanism, 142: taped-component feeding device, 144: support shaft, 146: pivot arm, 148: operating lever, 150: cam, 152: taped component, 154: engaging/disengaging device, 156: sprocket, 158: electric motor, 160: rotation transmitting mechanism, 162: taped-component feeding device, 164: support shaft, 166: pivot arm, 168: operating lever, 170: cam, 180: square pipe, 182: passage, 190: carrier tape, 192: cover tape, 194: component-accommodating recess, 196: perforation, 198: component (electronic circuit component), 199: reel, 200: cover, 202: protruding portion, 204: opening, 206: front edge, 208, 210: feed gear, 212: electric motor, 214: cover-tape feeding device, 220: recess, 222: positioning member, 224: positioning protruding portion, 226: cutout, 228: rotation position detector, 230: guide-portion holding portion, 232: receiving groove, 234: flange, 236: holding groove, 240: base member, 246: positioning device, 248: bracket, 250: positioning pin, 252: positioning hole, 258: peeled-carrier-tape guide member, 262: peeled carrier tape, 264: first guide portion, 266: second guide portion, 267: first guide face, 268: second guide face, 268a: inclined portion, 270: peeled-carrier-tape twisting device, 270: opening, 272: cutout, 274: tongue piece, 280: guide portion, 300: feeder, 301: feeder body, 302: first taped-component feeding device, 304: second taped-component feeding device, 306: first component supply portion, 308: second component supply portion, 334: first taped-component guide device, 348: first peeled-carrier-tape guide device, 350: second taped-component guide device, 352: second peeled-carrier-tape guide device, 360: first cover-tape peeling device, 362: first cover tape container, 364: first cover, 366: first cover-tape feeding device, 377: second cover, 382: second cover-tape feeding device, 384: second cover-tape peeling device, 386: second cover tape container, 410, 412: feeder, 414: feeder body, 420: taped-component feeding device, 422: cover-tape feeding device, 448: component supply portion, 470: feeder body, 472: connection shaft, 474: fixed portion, 476: pivot portion, 490: cover, 492; the component supply portion, 520: feeder holding table, 522: T-shaped groove, 524: fitting protruding portion, 526: operating lever, 528: lock device, 550: feeder body, 552: feeder, 554: feeder holding member, 556: cover, 558: component supply portion, 560: feeder holding member, 562, 564: feeder, 568: feeder body, 570, 572: component supply portion

The invention claimed is:

1. An electronic-circuit-component supplying device comprising:
a plurality of tape feeders each configured to feed a taped component in a longitudinal direction of a carrier tape, the taped component having a plurality of component-accommodating recesses arranged at regular pitches in the longitudinal direction and each accommodating an electronic circuit component, the plurality of tape feeders each being configured to sequentially position the plurality of component-accommodating recesses at a component supply portion, each of the plurality of tape feeders including:
a first portion including: (i) the component supply portion, and (ii) a taped-component guide portion configured to guide the taped component drawn from a reel on which the taped component is wound to the component supply portion, and
a second portion including a taped component feeding device configured to feed the taped component to the component supply portion, the second portion being configured to hold the first portion such that the first portion is movable in the longitudinal direction while being held by the second portion, the second portion being separable from the first portion; and
a feeder holding device configured to hold the plurality of tape feeders in a state in which the respective component supply portions of the plurality of tape feeders are arranged in a plurality of rows along a plurality of straight lines extending parallel to each other in one plane, wherein:
when the first portion is mounted on the second portion, the component supply portion is disposed at a component supply position at which the electrical circuit component is picked up.

2. The electronic-circuit-component supplying device according to claim 1, wherein:
- each of the plurality of tape feeders further includes a reel holding portion configured to hold the reel, and
- the reel holding portion, the component supply portion, and the taped-component guide portion form a removable mounting unit configured to be integrally mountable on and removable from the feeder holding device.

3. The electronic-circuit-component supplying device according to claim 2, wherein:
- each of the plurality of tape feeders is separable into the first portion, the second portion and the reel holding portion, and
- the first portion is configured as the removable mounting unit that is mountable on and removable from the second portion.

4. The electronic-circuit-component supplying device according to claim 3, wherein the taped-component feeding device includes:
- a feeding member including at least one protruding portion engageable selectively with one of perforations formed in the carrier tape at regular pitches;
- a drive device configured to drive the feeding member; and
- an engaging/disengaging device configured to move at least the feeding member to an engaged position at which the protruding portion is engaged with the perforation and a disengaged position at which the protruding portion is disengaged from the perforation.

5. The electronic-circuit-component supplying device according to claim 3, wherein the second portion is mountable on and removable from the feeder holding device.

6. The electronic-circuit-component supplying device according to claim 3, wherein the second portion is capable of holding a plurality of the first portions as a removable-mounting-unit group.

7. The electronic-circuit-component supplying device according to claim 2, wherein each taped-component guide portion is a straight guide portion extending straight and inclined so as to be higher at an end portion thereof near the component supply portion than at an end portion thereof near the reel holding portion, and a plurality of the removable mounting units are arranged in a state in which a plurality of groups of the straight guide portions are spaced apart from one another in a direction that is parallel to a plane including the plurality of straight lines and that is perpendicular to the plurality of straight lines.

8. The electronic-circuit-component supplying device according to claim 1, wherein:
- each of the plurality of tape feeders further includes a reel holding portion configured to hold the reel,
- the plurality of tape feeders are divided into N groups each corresponding to one of rows of the component supply portions, where N is a natural number equal to or greater than two,
- in each of the N tape feeder groups, the component supply portions are arranged in an arrangement direction parallel to the plurality of straight lines at pitches each less in length than N times a width of each of the component supply portions, and
- when the component supply portion is positioned at a front side of the tape feeder, and the reel holding portion is positioned at a rear side of the tape feeder, a peeled carrier tape from which the electronic circuit component has been taken out in one of the component supply portions belonging to a rear row is discharged frontward through a position between corresponding adjacent two of the component supply portions belonging to a front row.

9. The electronic-circuit-component supplying device according to claim 8, further comprising a peeled-carrier-tape twisting device configured to guide, toward a space between the component supply portions belonging to the front row, the peeled carrier tapes each being discharged from the component supply portion belonging to the rear row, while twisting the peeled carrier tape about a center line extending in the longitudinal direction to reduce a width of the peeled carrier tape in the arrangement direction.

10. A tape feeder configured to feed a taped component in a longitudinal direction of a carrier tape, the taped component having a plurality of component-accommodating recesses arranged at regular pitches in the longitudinal direction and each accommodating an electronic circuit component, the tape feeder being configured to sequentially position the plurality of component-accommodating recesses at a component supply portion, the tape feeder comprising:
- a first portion including: (i) the component supply portion, and (ii) a taped-component guide portion configured to guide the taped component drawn from a reel on which the taped component is wound to the component supply portion; and
- a second portion including a taped-component feeding device configured to feed the taped component to the component supply portion, the second portion being configured to hold the first portion such that the first portion is movable in the longitudinal direction while being held by the second portion, the second portion being separable from the first portion, wherein:
- when the first portion is mounted on the second portion, the component supply portion is disposed at a component supply position at which the electrical circuit component is picked up.

* * * * *